(12) United States Patent
Suzuki et al.

(10) Patent No.: US 10,776,052 B2
(45) Date of Patent: Sep. 15, 2020

(54) INFORMATION PROCESSING APPARATUS, DATA COMPRESSING METHOD, AND COMPUTER-READABLE RECORDING MEDIUM

(71) Applicant: FUJITSU LIMITED, Kawasaki-shi, Kanagawa (JP)

(72) Inventors: Kosuke Suzuki, Ota (JP); Jun Kato, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 275 days.

(21) Appl. No.: 15/890,555

(22) Filed: Feb. 7, 2018

(65) Prior Publication Data

US 2018/0232182 A1  Aug. 16, 2018

(30) Foreign Application Priority Data

Feb. 16, 2017  (JP) .................................. 2017-027056

(51) Int. Cl.

| G06F 12/00 | (2006.01) |
| G06F 13/00 | (2006.01) |
| G06F 13/28 | (2006.01) |
| G06F 3/06 | (2006.01) |
| H03M 7/30 | (2006.01) |

(52) U.S. Cl.
CPC .......... *G06F 3/0661* (2013.01); *G06F 3/0608* (2013.01); *G06F 3/0644* (2013.01); *G06F 3/0679* (2013.01); *H03M 7/30* (2013.01); *H03M 7/3068* (2013.01); *H03M 7/3084* (2013.01); *H03M 7/3091* (2013.01)

(58) Field of Classification Search
CPC ...... G06F 3/0608; H03M 7/30; H03M 7/3068
USPC ....................................................... 711/103
See application file for complete search history.

(56) References Cited

FOREIGN PATENT DOCUMENTS

| JP | 2003-319186 A | 11/2003 |
| JP | 2010-061518 A | 3/2010 |

*Primary Examiner* — Edward J Dudek, Jr.
*Assistant Examiner* — Sidney Li
(74) *Attorney, Agent, or Firm* — Fujitsu Patent Center

(57) ABSTRACT

A specifying unit specifies one or more dividing positions in input data. A common region compressing unit specifies compression positions in the input data corresponding to positions at which sizes from two ends of compressed, data are equal to or larger than a predetermined, size and corresponding to positions which sandwich adjacently-positioned dividing positions and of which a size therebetween is equal to or larger than the predetermined size and compresses former compression data that are arranged in a row in the input data on either side of each of the dividing positions and that are interposed between the compression positions. An individual region compressing unit compresses latter compression data that are separated fay any of the pieces of former compression data in the input data, based on the former compression data positioned adjacent to the piece of latter compression data and the piece of latter compression data.

8 Claims, 28 Drawing Sheets

FIG.20

| COMPRESSING METHODS | READ 4 KB (IOPS) | COMPRESSION RATIOS |
|---|---|---|
| WHOLE COMPRESSION | 285 K | GOOD |
| DIVIDED COMPRESSION | 460 K | NOT GOOD |
| OVERLAP COMPRESSION | 460 K | GOOD |

INFORMATION PROCESSING APPARATUS, DATA COMPRESSING METHOD, AND COMPUTER-READABLE RECORDING MEDIUM

CROSS-REFERENCE TO RELATED APPLICATION

This application is based upon and claims the benefit of priority of the prior Japanese Patent Application No. 2017-027056, filed on Feb. 16, 2017, the entire contents of which are incorporated herein by reference.

FIELD

The embodiments discussed herein are related to art information processing apparatus, a data compressing method, and a data compressing computer program.

BACKGROUND

Solid State Drives (SSDs) have a great advantage over hard disks for enabling reading and writing of data at a higher speed while keeping the electric power consumption lower. Additionally, in recent years, since SSDs have become available at lower prices, practicability of SSDs is getting higher, and more and more storage devices using SSDs have been put in practical use. A large-scale storage device in which a plurality of SSDs are connected together is called an All Flash Array (AFA). A storage device provided with an AFA includes, for example, a Central Processing Unit (CPU) serving as an arithmetic processing unit, a Dual Inline Memory Module (DIMM) structured with a plurality of Dynamic Random Access Memories (DRAMs), and the SSDs.

Because AFAs use SSDs, there is a demand for reducing the number of times of data writing and for keeping the amount of saved data small. To meet the demand, AFAs use two techniques, namely, a duplicate elimination technique and a compression technique.

The duplicate elimination technique is a technique by which duplicate data is saved only in one location of an AFA, so that all the files having the data are caused to refer to the location. The compression technique is a technique by which, when data is written from a memory to an SSD, the data is compressed and saved, so that the compressed data is read from the SSD into a memory and decompressed into the memory. As for compressing methods, in many situations Lempel-Ziv (LZ)-based compressing methods are used by which a compressing process is performed while omitting mutually the same patterns by making a forward reference. When LZ-based compressing methods are used, it is possible to decompress the data at a high speed.

According to a duplicate elimination technique, an AFA manages pieces of data stored in the SSDs, by using meta data that stores therein information about the pieces of data stored in the SSDs. The meta data is kept in a memory at all times for the purpose of eliminating duplicates and performing compressing processes at a high speed.

For example, to realize a duplicate elimination process, the meta data has Physical Block Addresses (PBAs) of the pieces of data saved in the SSDs and hash values used for eliminating the duplicates. Further, in the situation where the data stored in the SSDs is managed by using the meta data, when the data size managed by each piece of meta data is too large or too small, performance is degraded.

For example, when the data size is small, because the number of pieces of meta data arranged in the DRAMs increases and because the volume in the memories occupied by the meta data also increases, the volume in the memories that, is usable for other processing processes becomes smaller, which leads to a degradation of performance. On the contrary, when the data size is large, because the cache size in the memories also becomes large and because the volume in the memories is wastefully used by, for example, placing unused data in the DRRMs, the volume in the memories that is usable for other processing processes becomes smaller, which leads to a degradation of performance. For these reasons, it is desirable to determine the data size managed by the meta data on the basis of the number of pieces of meta data and the cache size. For example, the data size managed by the meta data may be 8 KB.

As explained above, AFAs perform the duplicate elimination processes in units each having the data size managed by the meta data. For example, when the data size managed by the meta data is 8 AFA performs the duplicate elimination processes in units of 8 KB.

In contrast, for SSDs, because many data accesses are made in units of 4 KB in various application programs, the performance of commonly-used products is optimised for processes performed in units of 4 KB serving as a page size.

Further, a conventional technique is known by which data is divided into sections, so that pieces of data having mutually the same contents are compressed together in one piece as common data. Another conventional technique is also known, by which an image is compressed, as being divided into predetermined blocks, so that it is possible to partially restore the image at the time of restoration.

Patent Literature 1: Japanese Laid-open Patent Publication No. 2010-61518

Patent Literature 2: Japanese Laid-open Patent Publication No. 2003-319186

However, as explained above, there is a situation to consider where the management size of data used by an AFA and the unit size of data used by the SSDs are different from each other. In that situation, there is a possibility that, in response to a data read request, the AFA may read data in a wasteful manner. For example, when the AFA manages data in units of 8 KB, whereas data stored in the SSDs is accessed in units of 4 KB, the AFA reads and decompresses 8-KB data when receiving a request to read 4-KB data and responses with designated data corresponding to 4 KB selected out of the decompressed data. Thus, the reading and decompressing of the data corresponding to 4 KB is wasted. As explained herein, when the conventional compression technique of AFAs is used, the performance in the compressing and decompressing processes is degraded due to the inconsistency in sizes by which the data is handled. Thus, there is a possibility that the processing capability such as that expressed with an Input Output Per Second (IOPS) value may be lowered.

To cope with this situation, one possible method is to compress the 8-KB data by dividing the data into sections of 4 KB and to store the boundary in a memory. In that situation, in response to a request to read 4-KB data, it is possible to read and decompress 4-KB data that has been read. For example, when 8-KB data is compressed altogether, the IOPS value for a request to read 4-KB data is 285K IOPS. In contrast, when the data is compressed after being divided into sections of 4 KB, the IOPS value for a request to read 4-KB data is 460 K IOPS. However, when the data is compressed after being divided into sections of 4 KB, the compression ratio is lower than in the situation where the 8-KB data is compressed altogether. For this reason, the amount of data which the AFA is able to store therein becomes smaller.

Further, even by using the conventional technique by which data is divided, into sections so that pieces of data having mutually the same contents are compressed together in one piece as common data, when the sizes by which the data is handled is inconsistent, there is a possibility that the compression ratio may be lowered because the data is handled in the same manner as in the situation where the data is compressed after being divided into sections of 4 KB. Further, even by using the conventional technique by which data is partially restored at the time of restoration, there is a possibility that the processing capability may be degraded and/or that the compression ratio may be lowered, due to the compressed data in the situation where the sizes by which the data is handled are inconsistent.

SUMMARY

According to an aspect of an embodiment, an information processing apparatus includes: a specifying unit that specifies one or more dividing positions used for dividing input data into sections each having a predetermined size; a former compressing unit that specifies compression positions in the input data corresponding to positions at which sizes from two ends of compressed data obtained by compressing the input data are equal to or larger than the predetermined size and corresponding to positions which sandwich adjacently-positioned dividing positions and of which a size therebetween is equal to or larger than the predetermined size and further performs a compressing process on each of pieces of former compression data that are arranged in a row in the input data on either side of each of the dividing positions and that are interposed between the compression positions; and a latter compressing unit that performs a compressing process on each of pieces of latter compression data that are separated by any of the pieces of former compression data in the input data, based on one or both of the pieces of former compression data positioned adjacent to the piece of latter compression data and the piece of latter compression data.

The object and advantages of the invention, will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 20 is a table illustrating a comparison of IOPS values and compression ratios at the time of reading observed when various compressing methods are used;

DESCRIPTION OF EMBODIMENTS

Preferred embodiments of the present invention will be explained, with reference to accompanying drawings. The information processing apparatus, the data compressing method, and the data compressing computer program of the present disclosure are not limited by the embodiments described below.

[a] First Embodiment

Figure 1:
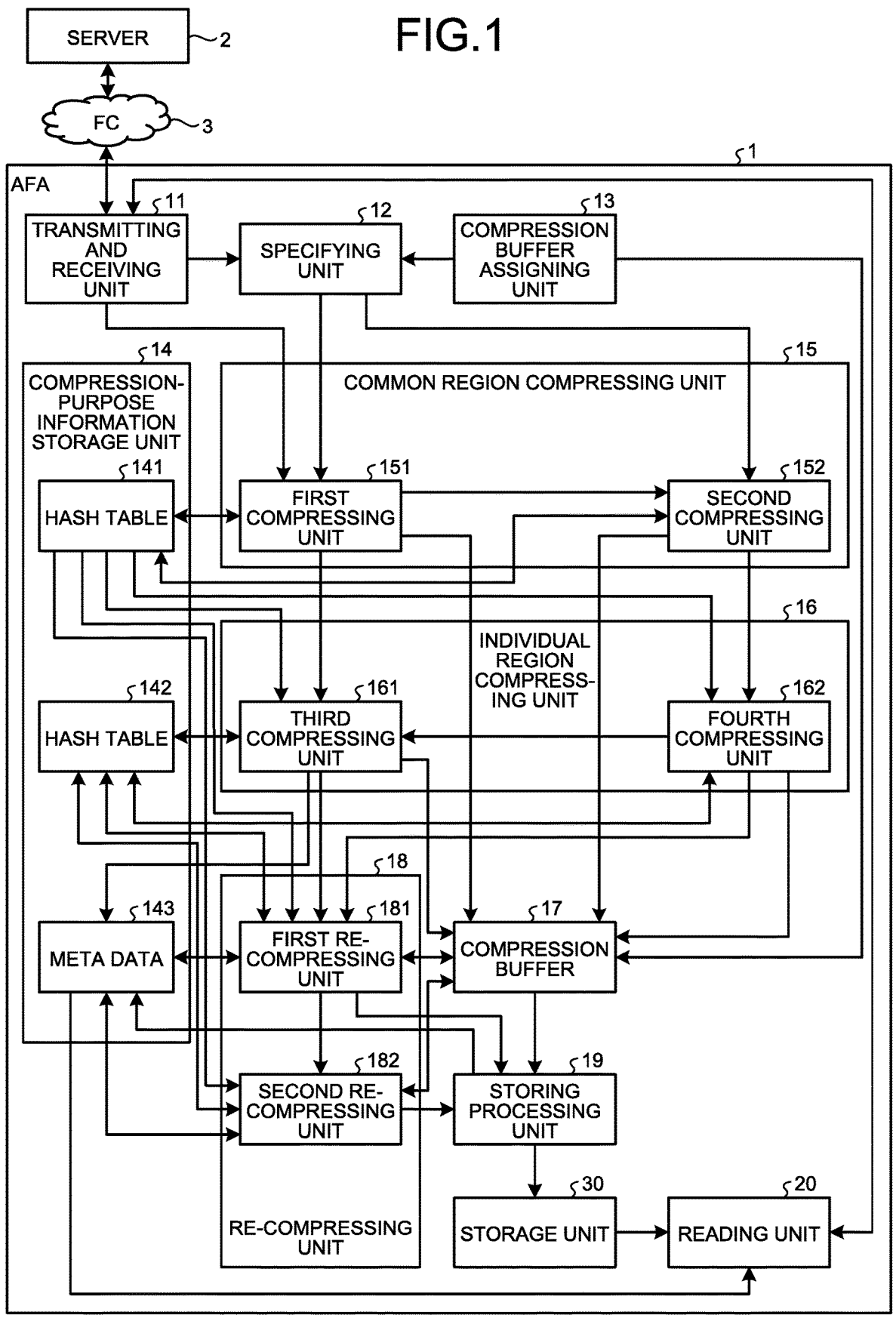
FIG. 1 is a block diagram of an AFA according to a first embodiment.

FIG. 1 is a block diagram of an AFA according to the first embodiment. As illustrating in FIG. 1, an AFA 1 is connected to a server 2 via a Fibre Channel (PC) 3. In response to an instruction from the server 2, the AFA 1 stores and reads data. In the following paragraphs, compressing and decompressing processes performed on data by the AFA 1 will primarily be explained; however, in actuality, the AFA 1 also performs processes such as a duplicate elimination process.

In the first embodiment, an example will be explained in which the AFA 1 manages data in units of 8 KB, which is a management unit of meta data when the duplicate elimination process is performed, and the AFA 1 reads and writes data in units of 4 KB. The size 4 KB corresponds to an example of the "predetermined size".

The AFA 1 includes a transmitting and receiving unit 11, a specifying unit 12, a compression buffer assigning unit 13, a compression-purpose information storage unit 14, a common region compressing unit 15, an individual region compressing unit 16, a compression buffer 17, a re-compressing unit 18, a storing processing unit 19, a reading unit 20, and a storage unit 30.

The transmitting and receiving unit 11 transmits and receives data to and from the server 2 via the PC 3. The transmitting and receiving unit 11 receives, from the server 2, a data write instruction together with data. Subsequently, the transmitting and receiving unit 11 divides the received data into sections each corresponding to the management unit of the meta data. In the first embodiment, because the management unit of the meta data is 8 KB, the transmitting and receiving unit 11 divides the obtained data into sections in units of 8 KB.

After that, the transmitting and receiving unit 11 notifies the specifying unit 12 of the size of the divided sections of data and also outputs the divided sections of data to the common region compressing unit 15. In the following explanation, the delta received by the common region compressing unit 15 (explained later) as an input from the transmitting and receiving unit 11 will be referred to as "input data 200".

Further, the transmitting and receiving unit 11 receives a data read instruction from the server 2. In the following explanation, the data designated in the read instruction will be referred to as "read data". The transmitting and receiving unit 11 notifies the reading unit 20 of the read instruction. Subsequently, as a response to the read instruction, the transmitting and receiving unit 11 receives an input of the read data from the reading unit 20. After that, the transmitting and receiving unit 11 transmits the obtained read data to the server 2.

The specifying unit 12 receives the notification about the size of the input data 200 from the transmitting and receiving unit 11. In the first embodiment, the specifying unit 12 receives the notification from the transmitting and receiving unit 11 indicating that the size of the input data 200 is 8 KB. Further, the specifying unit 12 receives a notification about the size of the compression buffer 17, from the compression buffer assigning unit 13. Subsequently, the specifying unit 12 specifies the center position of the input data 200. In the present example, the specifying unit 12 specifies the point corresponding to 4 KB from the head of the input data 200 as the center position of the input data 200. Further, the specifying unit 12 specifies the center position of the compression buffer 17. More specifically, the specifying unit 12 specifies the center position of the compression buffer 17, by specifying an offset from the head address of the compression buffer 17 to the address of the center position. After that, the specifying unit 12 outputs information about the center position of the input data 200 and information about the center position of the compression buffer 17 to the common region compressing unit 15. The center position of the input data 200 corresponds to an example of the "dividing position".

The compression buffer assigning unit 13 obtains the size of the compression buffer 17. Further, the compression buffer assigning unit 13 notifies the specifying unit 12 of the size of the compression buffer 17.

In this situation, in the compression buffer 17, addresses are sequentially assigned from one end to the other end. In the following explanation, the end of the compression buffer 17 at which the address has the smallest value will be referred to as the head, whereas the other end will be referred to as the tail end. Further, the input data 200 is a block of data in which pieces of data are arranged in a row. The input data 200, after having been compressed, is stored according to the order of the addresses in the compression buffer 17 starting from one end. In the following explanation, the end of the input data 200 stored at the address having the smallest value at the time of the storing will be referred to as the head, whereas the other end will be referred to as the tail end.

In the first embodiment, in a DRAM, the AFA 1 is provided, in advance, with the compression buffer 17 having a size of 8 KB. The reasons is that it is sufficient to prepare a region of 8 KB for the compression buffer 17, because the input data 200 is 8 KB, and the compressed data obtained by compressing the input data 200 will be 8 KB or smaller. Further, in the first embodiment, the compression buffer assigning unit 13 stores therein, in advance, information about the size of the compression buffer 17 being 8 KB and notifies the specifying unit 12 of the size according to the stored information. In the following explanation, the data obtained by compressing the input data 200 will be referred to as "compressed data 300".

It is noted, however, that the size of the compression buffer 17 may dynamically be changed. In that situation, the compression buffer assigning unit 13 forms the compression buffer 17 by preparing a region in a DRAM. Further, the compression buffer assigning unit 13 notifies the specifying unit 12 of the size of the prepared region.

The compression-purpose information storage unit 14 includes a hash table 141, a hash table 142, and meta data 143.

The hash table 141 is a table used when the common region compressing unit 15 performs a compressing process. In the first embodiment, the hash table 141 is generated in the compress ion-purpose information storage unit 14 by the common region compressing unit 15, when the common region compressing unit 15 performs the compressing process. The hash table 141 is also used when the individual region compressing unit 16 performs a compressing process.

The hash table 142 is a table used when the individual region compressing unit 16 performs a compressing process. In the first embodiment, the hash table 142 is generated in the compression-purpose information storage unit 14 by the individual region compressing unit 16 when the individual region compressing unit 16 performs the compressing process.

Figure 2:
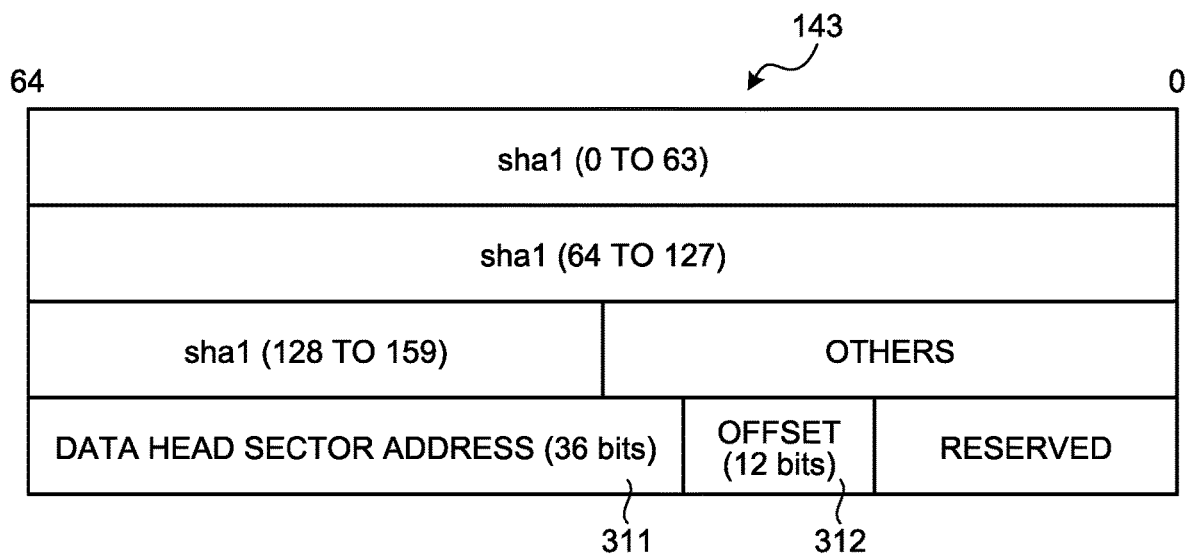
FIG. 2 is a drawing illustrating an example of meta data according to the first embodiment.

The meta data 143 is data used for performing the duplicate elimination process. FIG. 2 is a drawing illustrating an example of the meta data according to the first embodiment. The meta data 143 has a region for storing therein a hash value of 160 bits. The hash value contained in the meta data 143 is information used in the duplicate elimination process.

Further, the meta data 143 according to the first embodiment has a head address storing region 311 for storing therein a data head sector address indicating the head of the compressed data 300 obtained by compressing the input data 200 managed by the meta data 143. Further, the meta data 143 has an offset storing region 312 for storing therein an offset indicating the length from the head of the compressed data 300 obtained by compressing the input data 200 managed by the meta data 143 to the head of a common region (explained later). The meta data cox-responds to an example of the "management data".

Returning to the description of FIG. 1, the common region compressing unit 15 according to the first embodiment includes a first compressing unit 151 and a second compressing unit 152. The common region compressing unit 15 corresponds to an example of the "former compressing unit".

The term "common region" denotes an overlapping region between: a region read from the compressed data 300 when the former half data corresponding to the 4 KB in the former half of the input data 200 is read; and a region read from the compressed, data 300 when the latter half data corresponding to the 4 KB in the latter half of the input data 200 is read. As explained below, the common region contains a part of the former half data and a part of the latter half data. The first compressing unit 151 is configured to perform a compressing process on such a part of the common region that corresponds to the latter half data. The second compressing unit 152 is configured to perform a compressing process on such a part of the common region that corresponds to the former half data. In the following paragraphs, the first compressing unit 151 and the second compressing unit 152 will be explained in detail.

The first, compressing unit 151 receives an input of the input data 200 from the transmitting and receiving unit 11. Further, the first compressing unit 151 receives, from the specifying unit 12, an input of the information about the center position of the input data 200 and the information about the center position of the compression buffer 17. The first compressing unit 151 generates the hash table 141 into the compression-purpose information storage unit 14.

Figure 3:
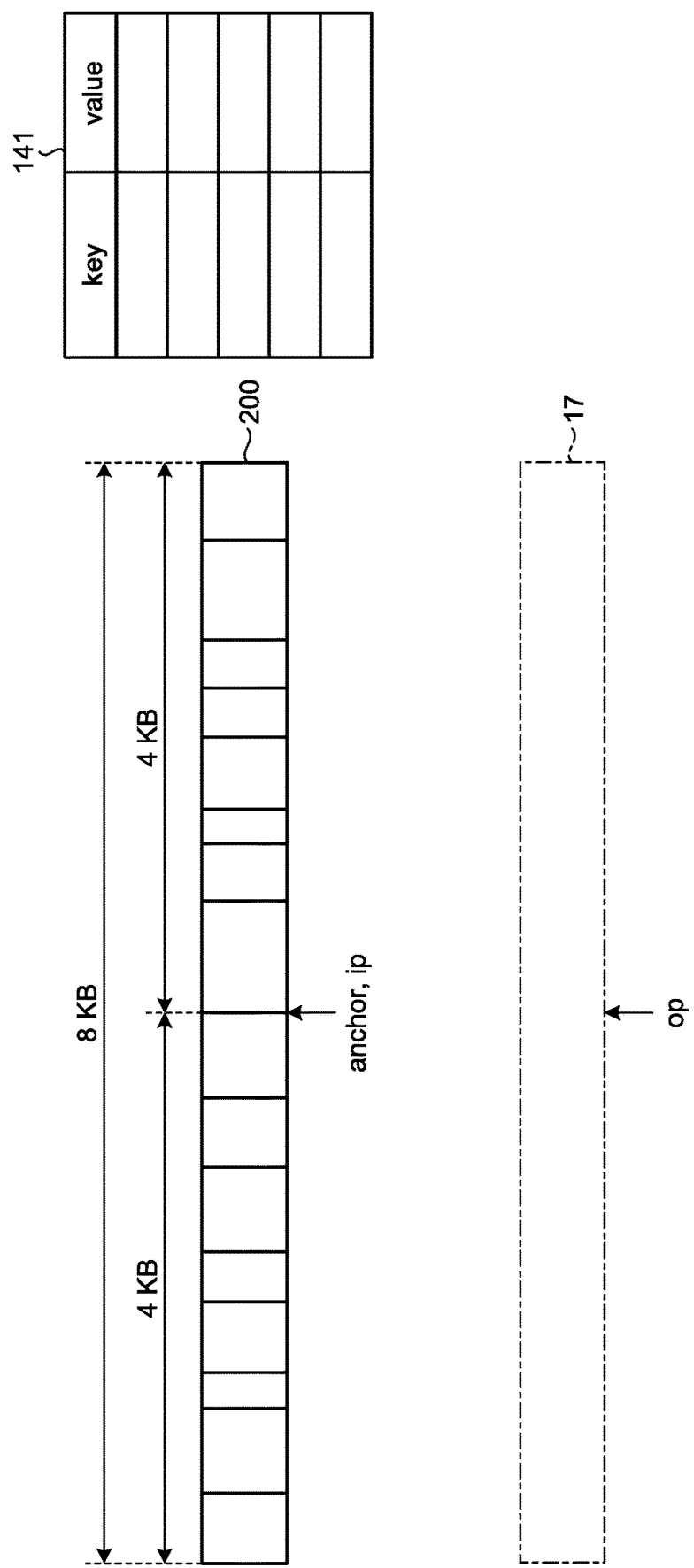
FIG. 3 is a drawing illustrating a state at the start of a compressing process performed by a first compressing unit.

Subsequently, the first compressing unit 151 sets an anchor pointer and an input (ip) pointer at the center position of the input data 200. Further, the first compressing unit 151 sets an output (op) pointer at the center position of the compression buffer 17. FIG. 3 is a drawing illustrating a state at the start of the compressing process performed by the first compressing unit. In FIG. 3, the arrow marked with the text "anchor" and "ip" and pointing to a position in the input data 200 represents the anchor pointer and the ip pointer. Further, the arrow marked with the text "op" and pointing to a position in the compression buffer 17 represents the op pointer. As illustrated in FIG. 3, the anchor pointer and the ip pointer are positioned at the center position of the input data 200, i.e., at such a position where the size from the head is 4 KB, while the size to the tail end is 4 KB.

Figure 4:
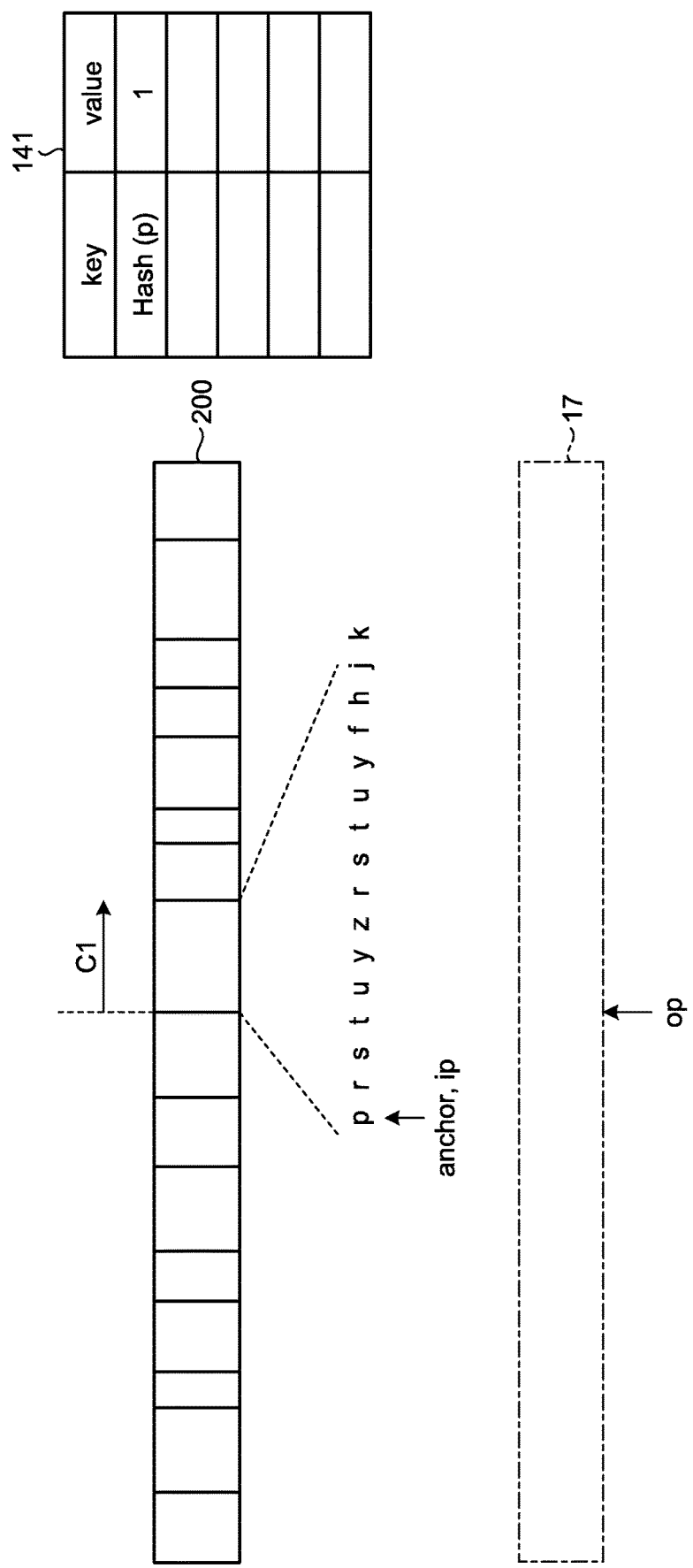
FIG. 4 is a drawing illustrating details of a state of data at the start of the compressing process performed by the first compressing unit.

Further, the first compressing unit 151 generates the hash table 141. In this state, because the compressing process has not yet been started, the hash table 141 is empty. FIG. 4 is a drawing illustrating details of a state of data at the start of the compressing process performed by the first compressing unit. In the following explanation, the compressing process performed by the first compressing unit 151 will be referred to as a compressing process C1. As illustrated in FIG. 4, the input data 200 has stored therein individual pieces of data. When starting the compressing process C1, the first compressing unit 151 sets the anchor pointer and the ip pointer with the data in the center position of the input data 200.

Subsequently, the first compressing unit 151 performs a hashing process on the data with which the ip pointer is set. After that, the first compressing unit 151 registers a key corresponding to the hashing result into the hash table 141. Further, in correspondence with the registered key, the first compressing unit 151 registers the position of the ip pointer into the hash table 141 as a value. For example, in FIG. 4, because the first piece of data "p" is the first (1st) one, the first compressing unit 151 sets the value thereof to 1.

Figure 5:
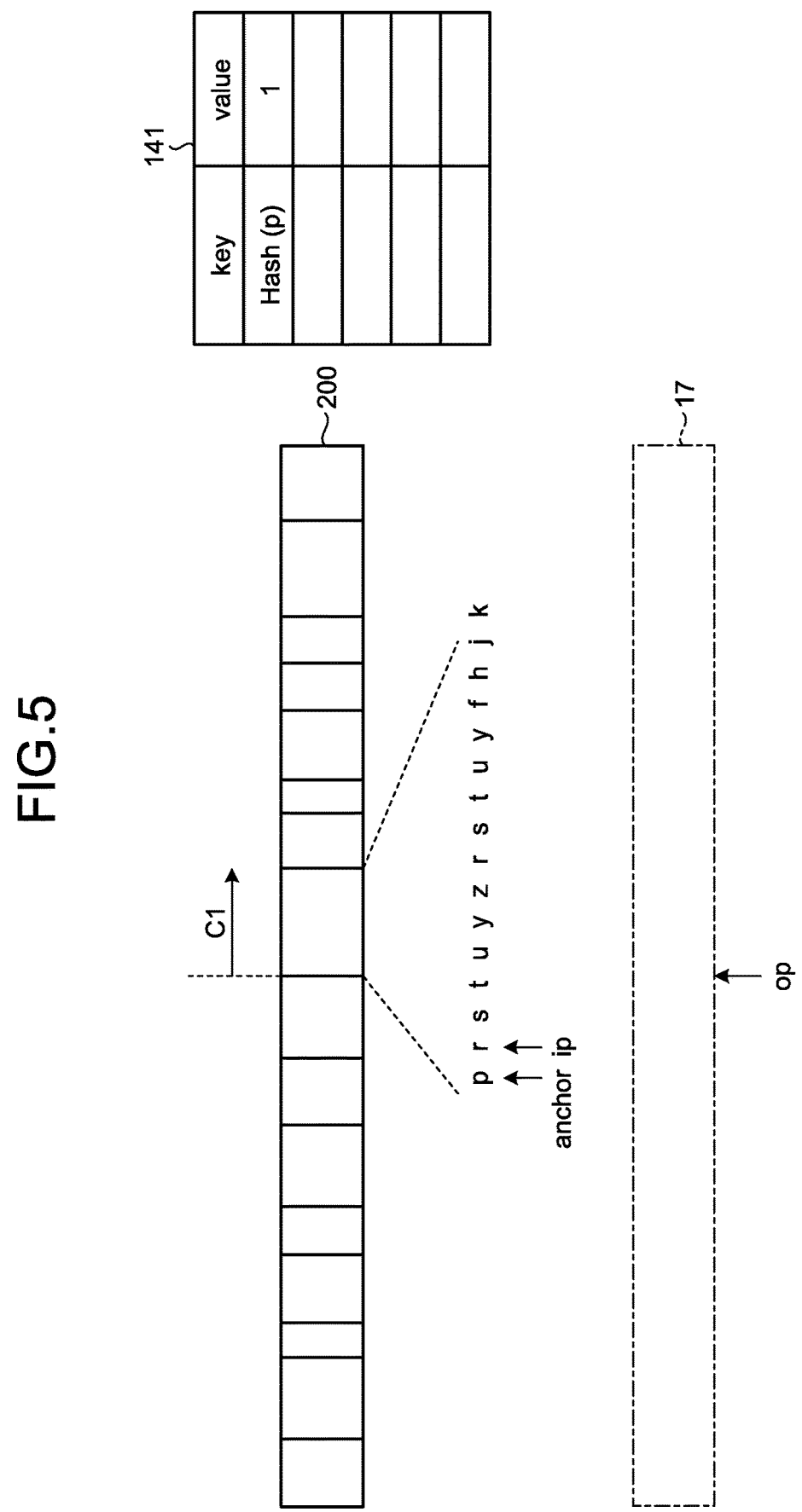
FIG. 5 is a drawing illustrating a situation in which the first compressing unit has moved an ip pointer.

Subsequently, as illustrated in FIG. 5, the first compressing unit 151 moves the ip pointer to the adjacently-positioned piece of data toward the tail end of the input data 200. FIG. 5 is a drawing illustrating a situation in which the first compressing unit has moved the ip pointer. After that, the first compressing unit 151 performs a hashing process on the data indicated by the ip pointer and judges whether or not a value corresponding to the hashing result has already been registered in the hash table 141. If the value has not yet been registered, the first compressing unit 151 registers the value and moves the ip pointer to the adjacently-positioned piece of data toward the tail end of the input data 200. In this manner, for each of the pieces of data indicated by the ip pointer, when a value corresponding to the hashing result has not yet been registered in the hash table 141, the first compressing unit. 151 repeatedly performs the process of registering the value and moving the ip pointer.

Figure 6:
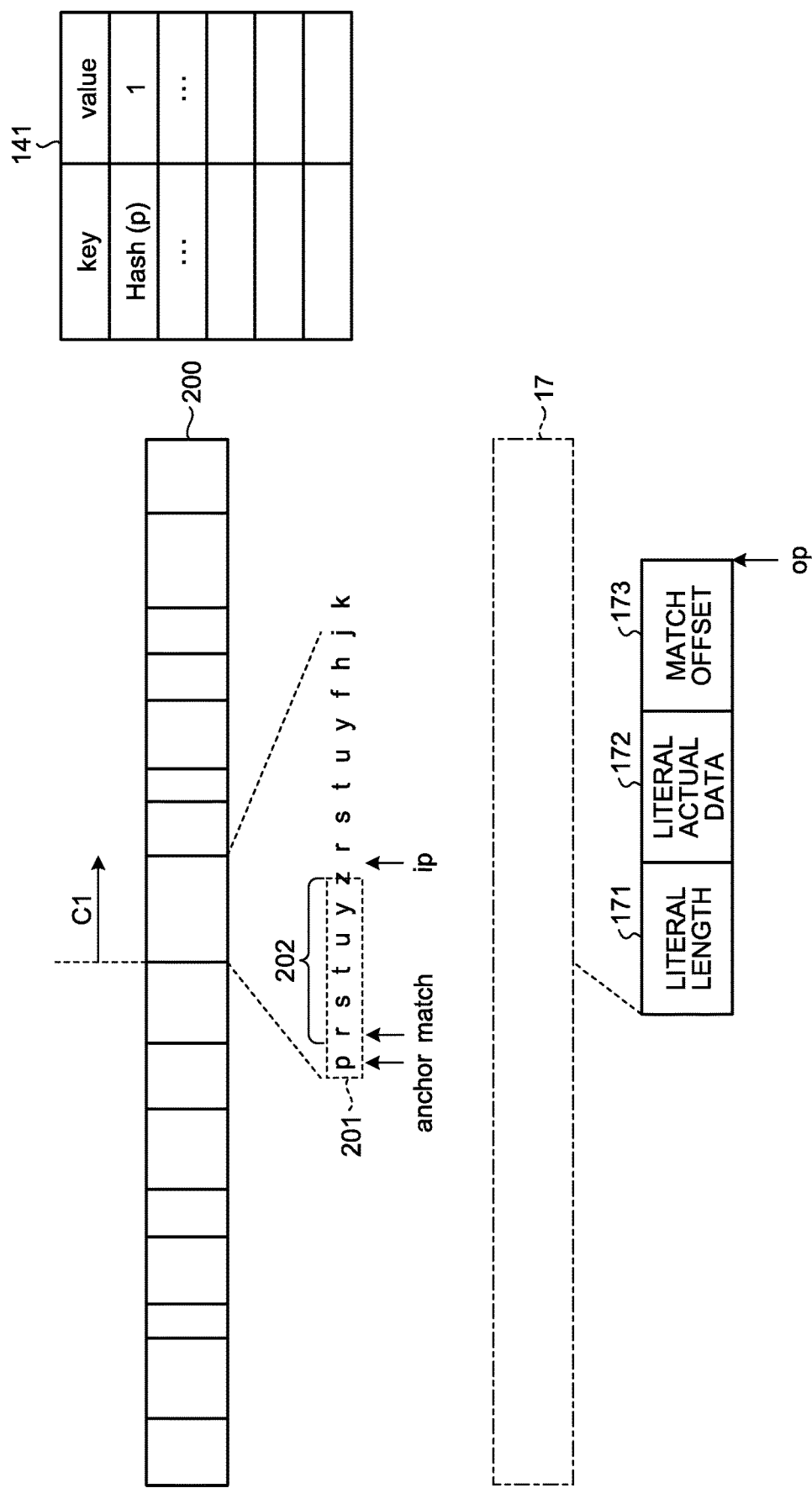
FIG. 6 is a drawing illustrating a situation in which the first, compressing unit has discovered a piece of data having the same value.

As illustrated in FIG. 6, the first compressing unit 151 identifies a piece of data of which the value corresponding to the hashing result from the piece of data indicated by the ip pointer has been registered in the hash table 141. FIG. 6 is a drawing illustrating a situation in which the first compressing unit has discovered a piece of data having the same value. After that, the first compressing unit 151 sets a match pointer with the piece of data having the same value as the data indicated by the ip pointer. In FIG. 6, the arrow marked with the text, "match" and pointing to a position in the input data 200 represents the match pointer. Further, the first compressing unit 151 starts an encoding process while defining the section from the anchor pointer to the ip pointer as "literal". The first compressing unit 151 calculates the length from the ip pointer to the anchor pointer. Because the calculated length is a literal length that has no same pattern, the first compressing unit 151 writes a literal length 171, starting from the position indicated by the op pointer. Further, the first compressing unit 151 writes data 201 as literal actual data 172 into the position adjacent to the literal length 171 on the tail end side of the compression buffer 17. Subsequently, the first compressing unit 151 calculates the length 202 from the ip pointer to the match pointer. Because the calculated length 202 is the offset from the ip pointer to the data having the same value, the first compressing unit 151 writes the calculated length 202 as a match offset 173 into the position adjacent to the literal actual data 172 on the tail end side of the compression buffer 17. The first, compressing unit 151 sets the op pointer to the position behind, the match offset 173.

Figure 7:
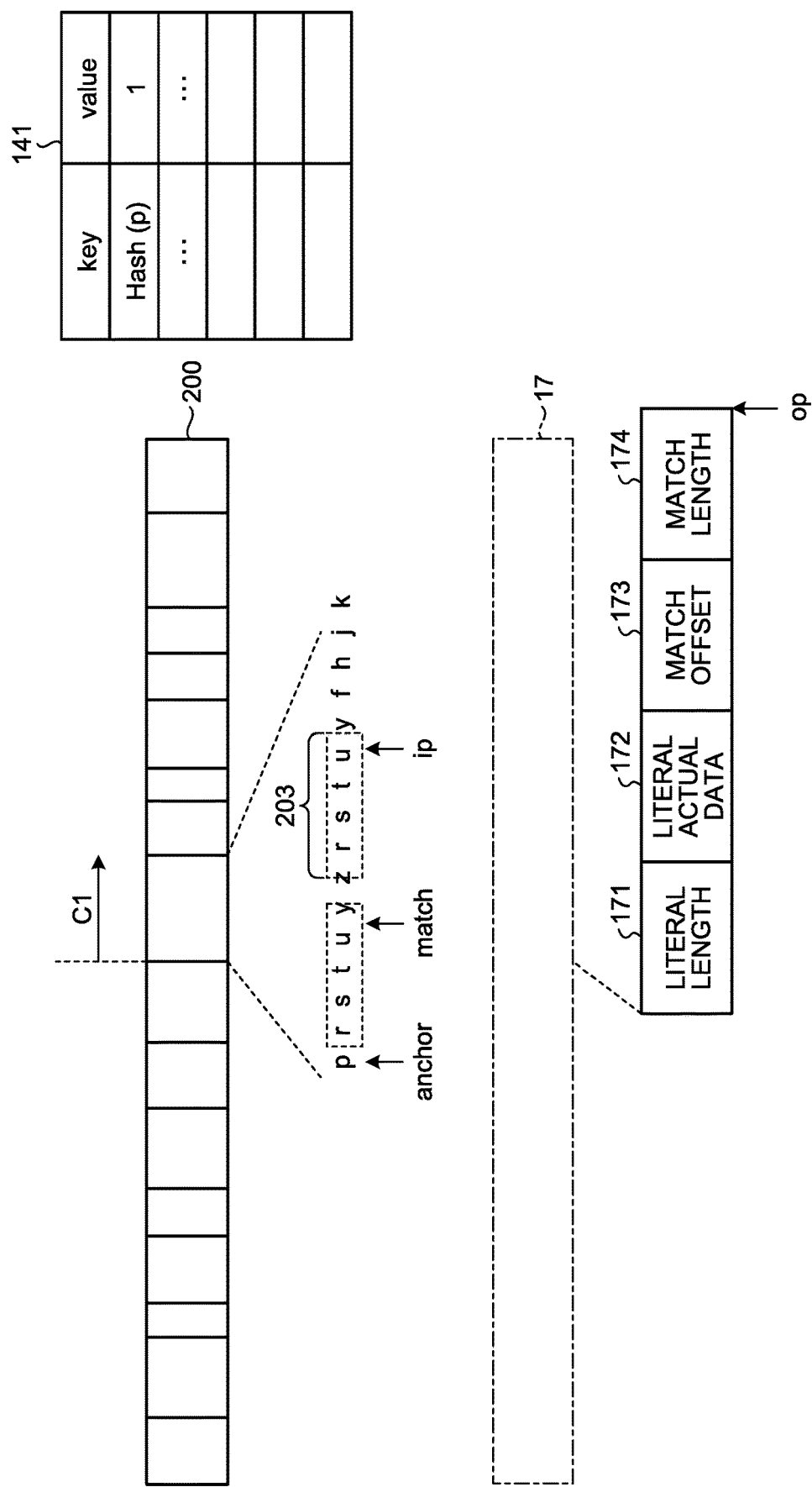
FIG. 7 is a drawing illustrating a situation in which the first compressing unit has confirmed a matching position.

Subsequently, the first compressing unit 151 moves the match pointer and the ip pointer toward the tail end of the input data 200 to check to see how far the values match. In the following explanation, when values are the same, we will use the expression "the values match". FIG. 7 is a drawing illustrating a situation in which the first compressing unit, has confirmed a matching position. When the matching position has been confirmed, the first compressing unit 151 obtains a matching data length 203. After that, the first compressing unit 151 writes the data length 203 as a match length 174 into the position adjacent to the match offset 173 on the tail end side of the compression buffer 17. The first compressing unit 151 sets the op pointer to the position, behind, the match length 174.

In this situation, the first compressing unit 151 obtains a pre-compression size x' from the compression start position to the compression completion position at this point in time. Further, the first compressing unit 151 obtains a post-compression size c' at this point in time.

In this situation, by dividing the post-compression size c' by the pre-compression size x', it is possible to calculate a provisional compression ratio y' indicating the compression ratio at this point in time. In other words, the provisional compression ratio y' is calculated as y'=c'/x'. The data having a size of 4 KB from the head of the compressed data 300 contains the former half data having a size of 4 KB from the head of the pre-compression input data 200. In this situation, when the compressed data 300 is decompressed from the head up to 4-KB in size, the result will contain the former half data of the input, data 200. Further, the common region contains the section up to the end of the data compressed by the first compressing unit 151. In other words, it is possible to obtain the former half data by decompressing the section from the head of the compressed data 300 to the end of the data compressed by the first compressing unit 151. Accordingly, it will be sufficient if it is possible to read the section from the head of the compressed data 300 to the end of the data compressed by the first compressing unit 151, by reading the data having a size of 4 KB from the head of the compressed data 300. In other words, it is sufficient if the size of the data from the head of the compressed data 300 to the end of the data compressed by the first, compressing unit 151 is equal to or smaller than 4 KB. Consequently, it is sufficient if the value obtained fay multiplying the sum of the size of the former half data, (4 KB) and the pre-compression size x' by the provisional compression ratio y' is equal to or smaller than 4 KB, i.e., if $(4+x') \times y' \leq 4$ is satisfied.

For this reason, the first compressing unit 151 judges whether or not the pre-compression size x' satisfies $x' \geq 4c'/(4-c')$, which is obtained by assigning the calculated provisional compression ratio $y'=c/x'$ to the expression $(4+x') \times y' \leq 4$. In the following explanation, the expression $x' \geq 4c'/(4-c')$ will be referred to as a "boundary judging expression". When the boundary judging expression is satisfied, the first compressing unit 151 continues the processing in the compressing process C1.

Figure 8:
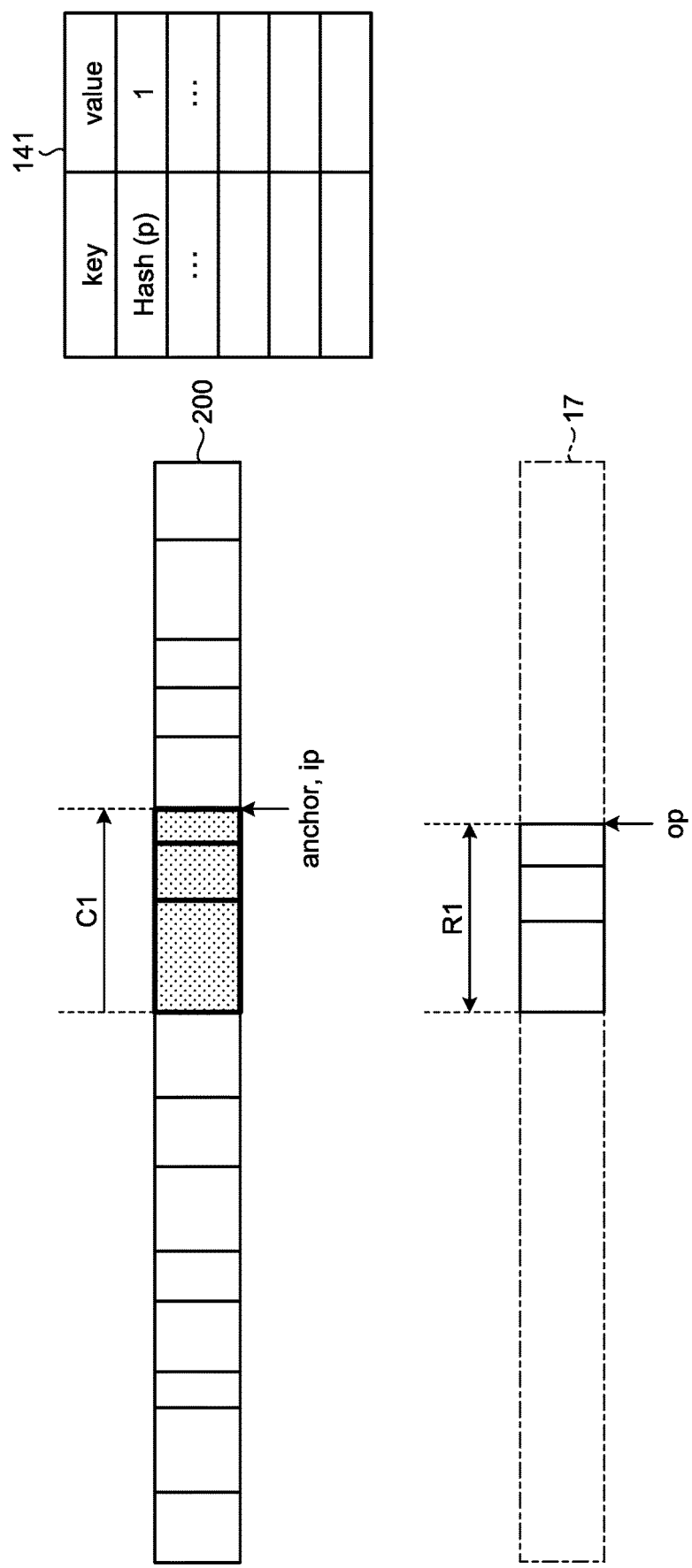
FIG. 8 is a drawing illustrating a situation in which the compressing process performed by the first compressing unit has been completed.

The first compressing unit 151 sets the anchor pointer and the ip pointer to the piece of data positioned adjacent to the matching data on the tail end side of the input data 200. After that, the first compressing unit 151 proceeds with the compressing process C1 toward the tail end of the input data 200. After that, every time a matching position is confirmed, the first compressing unit 151 calculates a pre-compression size and a post-compression size at the point in time and judges whether or not the boundary judging expression is satisfied. When the boundary judging expression is satisfied, the first compressing unit 151 continues performing the compressing process C1. On the contrary, when the boundary judging expression is not satisfied, the first compressing unit 151 determines the immediately-preceding match-confirmed position as a first compression position. In that situation, as illustrated in FIG. 8, the first compressing unit 151 returns the anchor pointer, the ip pointer, and the op pointer to the positions in which the last matching position was confirmed. FIG. 8 is a drawing illustrating the situation in which the compressing process performed by the first compressing unit has been completed. Accordingly, the first compressing unit 151 arranges the data obtained by compressing the section from the center position of the input data 200 to the first compression position, into a region R1 of the compression buffer 17 and thus ends the compressing process C1. In FIG. 8, the region shaded in gray in the input data 200 is the region on which the compressing process has been completed. Further, the regions framed with the bold line in the input data 200 are regions forming a common region.

As explained above, the first compressing unit 151 performs the compressing process C1 starting from the center position of the input data 200 toward the tail end thereof. After that, when having finished the compressing process C1, the first compressing unit 151 outputs the input data 200 to the second compressing unit 152.

Returning to the description of FIG. 1, the second compressing unit 152 receives the input of the input data 200 from the first compressing unit 151. Further, the second compressing unit 152 receives the input of the information about the center position of the input data 200 and the information about the center position of the compression buffer 17, from the specifying unit 12.

Figure 9:
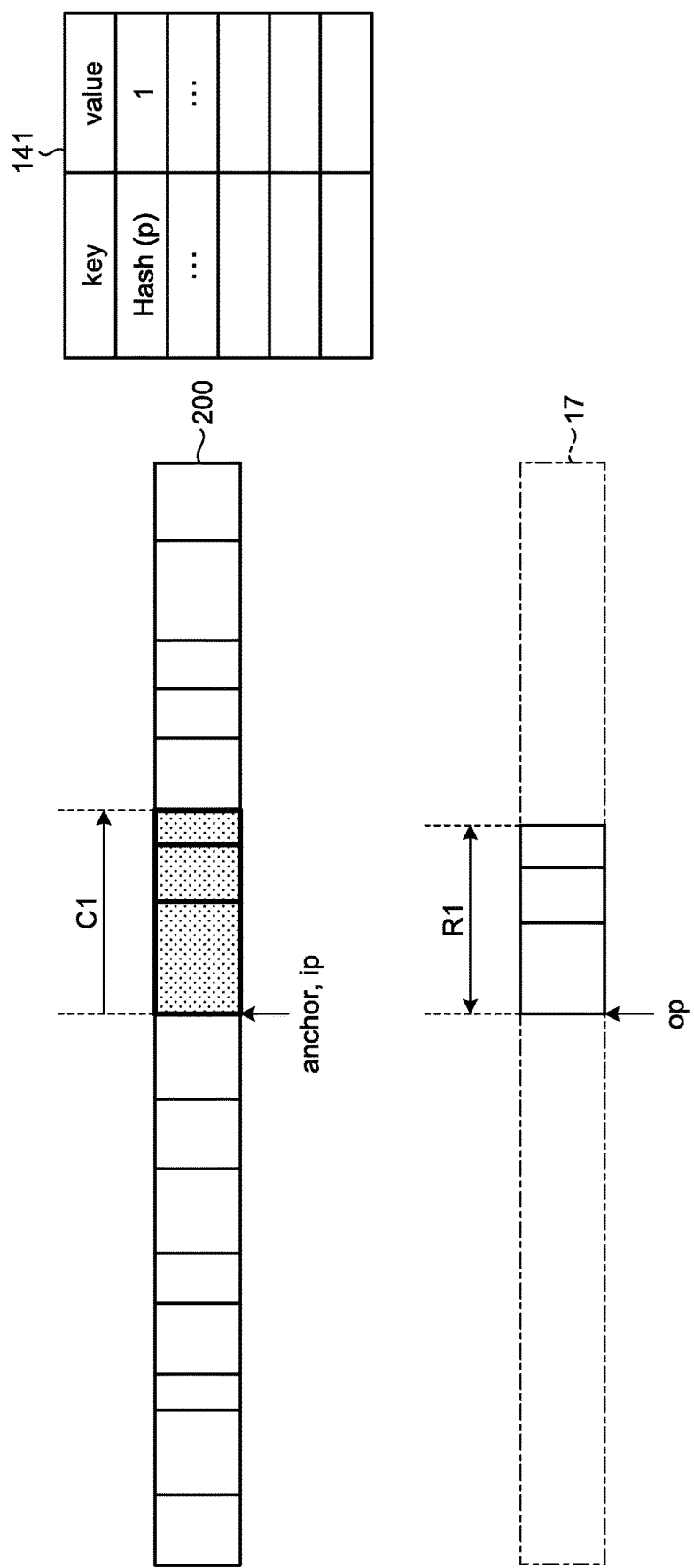
FIG. 9 is a drawing illustrating a state at the start of a compressing process performed by a second compressing unit.

Subsequently, the second compressing unit 152 returns the anchor pointer and the ip pointer to the center posit ion of the input data 200. Further, the second compressing unit 152 returns the op pointer to the center position of the compression buffer 17, to be in the situation illustrated in FIG. 9, FIG. 9 is a drawing illustrating the state at the start of the compressing process performed by the second compressing unit. After that, the second compressing unit 152 starts the compressing process from the center position of the input data 200 toward the head thereof.

Figure 10:
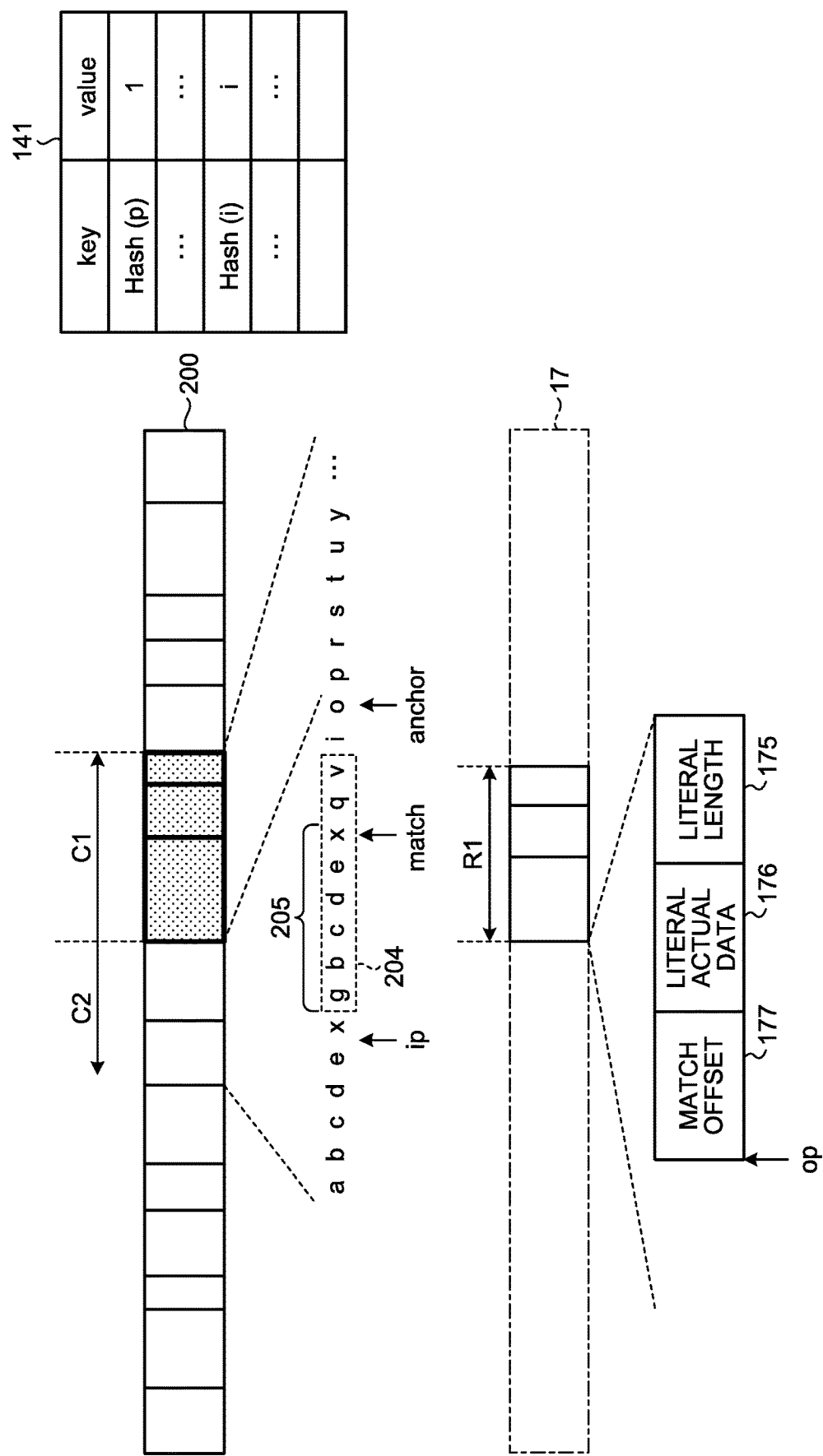
FIG. 10 is a drawing illustrating a situation in which the second compressing unit has discovered a piece of data having the same value.

As illustrated in FIG. 10, while moving the ip pointer from the center position of the input data 200 toward the head thereof, the second compressing unit 152 performs a compressing process C2 by using the hash table 141. FIG. 10 is a drawing illustrating a situation in which the second compressing unit has discovered a piece of data having the same value.

As illustrated, in FIG. 10, the second compressing unit 152 judges from the hash table 141 whether or not there is a value corresponding to the hashing result of the data indicated by the ip pointer. When the value corresponding to the hashing result of the data indicated by the ip pointer is not present in the hash table 141, the second compressing unit 152 registers a key and a value corresponding to the hashing result of the data indicated by the ip pointer, into the hash table 141.

When the value corresponding to the hashing result of the data indicated by the ip pointer is present, the second compressing unit 152 sets the match pointer with a piece of data having the same value as the data indicated by the ip pointer. In this situation, the hash table 141 has already registered therein the keys and the values generated in the compressing process C1. Accordingly, the second compressing unit 152 is able to use duplicates between the compression target data and the data used in the compressing process C1, also for the compressing process. In other words, the second compressing unit 152 judges whether or not the value corresponding to the hashing result of the data indicated by the ip pointer matches any of the values of the data used in the compressing process C1. If none of the values matches, the second compressing unit 152 subsequently judges whether or not the values of the compression target data in the compressing process C2 match.

Further, the second compressing unit 152 sets the match pointer with a piece of data having a matching value. After that, the second compressing unit 152 starts an encoding process while defining the section from the anchor pointer to the ip pointer as "literal". The second compressing unit 152 calculates the length from the ip pointer to the anchor pointer. Further, the second compressing unit 152 writes a literal length 175, starting from the position indicated by the op pointer. Subsequently, the second compressing unit 152 writes data 204 as literal actual data 176 into the position adjacent to the literal length 175 on the head side of the compression buffer 17. After that, the second compressing unit 152 writes the length 205 from the ip pointer to the match pointer as a match offset 177 into the compression buffer 17 at the position adjacent to the literal actual data 176 on the head side of the compression buffer 17. The second compressing unit 152 sets the op pointer to the position behind the match offset 177.

Figure 11:
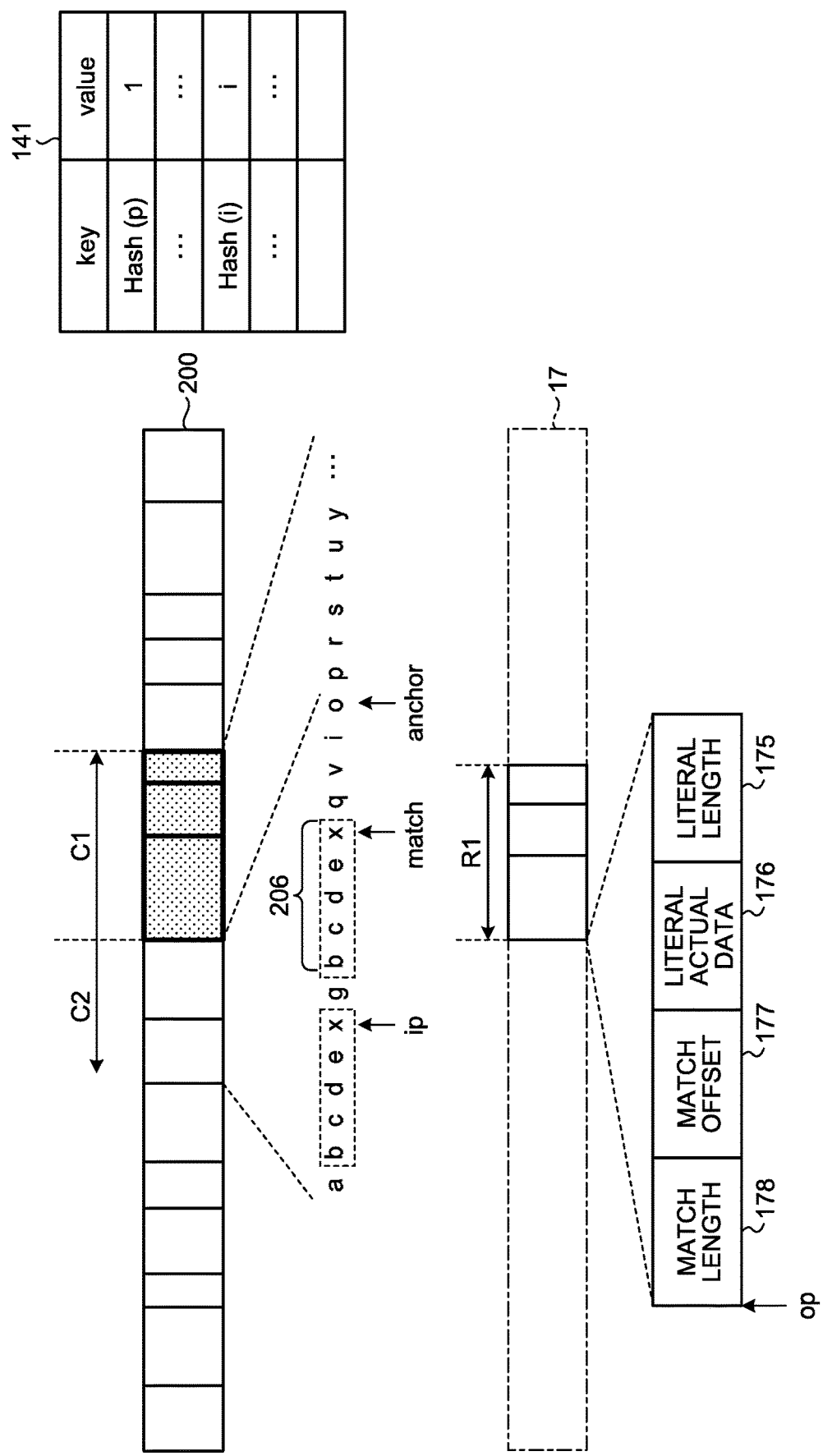
FIG. 11 is a drawing illustrating a situation in which the second compressing unit has confirmed a matching position.

Subsequently, the second compressing unit 152 moves the match pointer and the ip pointer toward the head of the input data 200 to check to see how far the values match. FIG. 11 is a drawing illustrating a situation in which the second compressing unit has confirmed a matching position. When the matching position has been confirmed, the second compressing unit 152 obtains a matching data length 206. After that, the second compressing unit 152 writes the data length 206 as a match length 178 into the position adjacent to the match offset 177 on the head side of the compression buffer 17. The second compressing unit 152 sets the op pointer to the position behind the match length 178.

In this situation, the second compressing unit 152 obtains a pre-compress ion size x' from the compression start position to the compression completion position at this point in time. Further, the second compressing unit 152 obtains a post-compression size c' at this point in time. Subsequently, the second compressing unit 152 judges whether or not the obtained pre-compression size x' and post-compression size c' satisfy the boundary judging expression.

Figure 12:
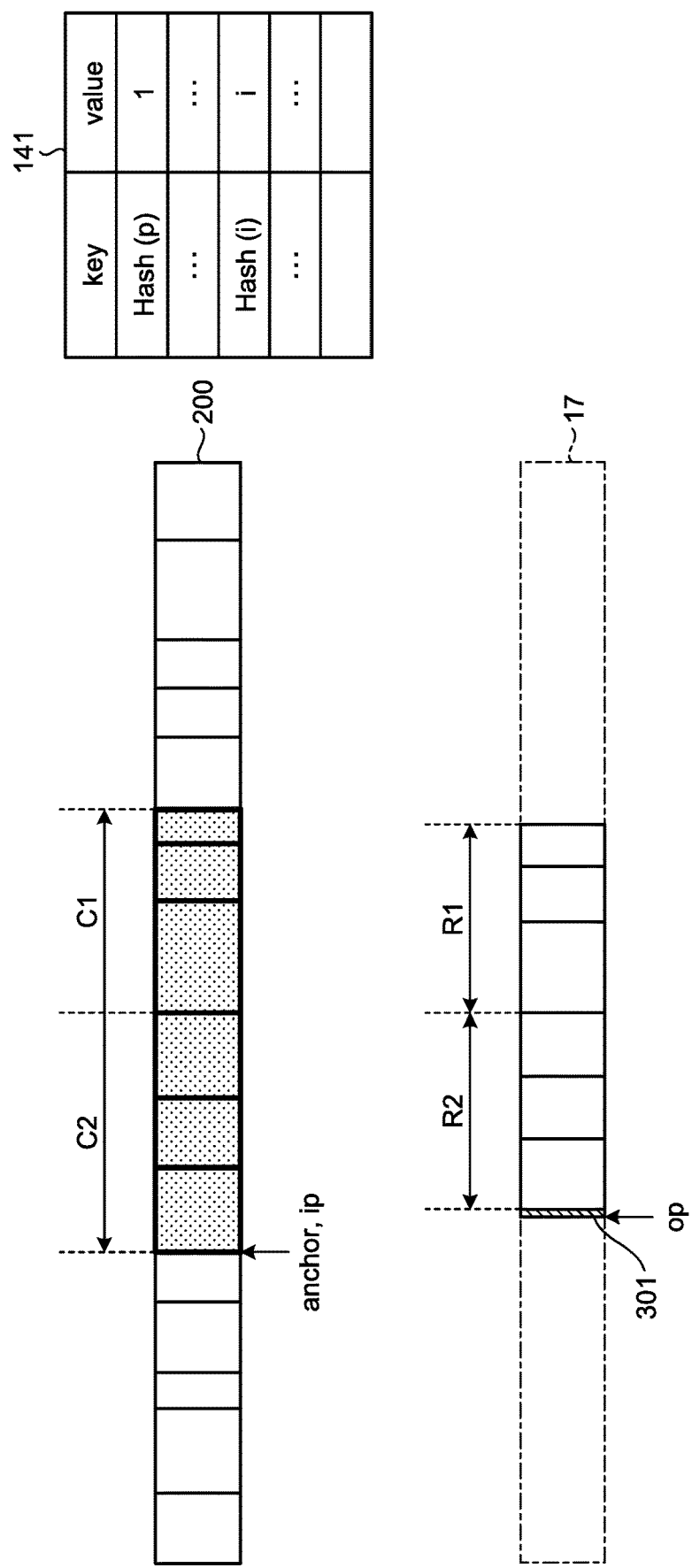
FIG. 12 is a drawing illustrating a situation in which the compressing process performed by the second compressing unit has been completed.

Every time a matching position is confirmed, the second compressing unit 152 calculates a pre-compression size and a post-compress ion size at the point in time and judges whether or not the boundary judging expression is satisfied. When the boundary judging expression is satisfied, the second compressing unit 152 continues performing the compressing process C2. On the contrary, when the boundary judging expression is not satisfied, the second compressing unit 152 determines the immediately-preceding match-confirmed position as a second compression position. In that situation, as illustrated in FIG. 12, the second compressing unit 152 returns the anchor pointer, the ip pointer, and the op pointer to the positions in which the last matching position was confirmed, FIG. 12 is a drawing illustrating the situation in which the compressing process performed by the second compressing unit has been completed. Accordingly, the second compressing unit 152 arranges the data obtained by compressing the section from the center position of the input data 200 to the second compression position, into a region R2 of the compression buffer 17 and thus ends the compressing process C2.

As explained above, the second compressing unit 152 performs the compressing process C2 starting from the center position of the input data 200 toward the head thereof. After that, when having finished the compressing process C2, into a 2-byte region 301 positioned adjacent to the region R2 on the head side of the compression buffer 17, the second compressing unit 152 stores the offset front that position to the center position of the compression buffer 17. The position of the head of the region R2 corresponds to an example of the "reference position". The offset corresponds to the "first relative distance". Subsequently, the second compressing unit 152 outputs the input data 200 to a fourth compressing unit 162 included in the individual region compressing unit 16. In the present example, although FIG. 12 illustrates the region 301 storing the offset therein in an enlarged manner to make it easier to understand, the region 301 in actuality is a very small region. Accordingly, in the following drawings, the region 301 will be indicated with a simple line segment.

Returning to the description of FIG. 1, the individual region compressing unit 16 includes a third compressing unit 161 and the fourth compressing unit 162. The individual region compressing unit 16 corresponds to an example of the "latter compressing unit".

The third compressing unit 161 performs a compressing process on the remaining region of the latter half data. Further, the fourth compressing unit 162 performs a compressing process on the remaining region of the former half data. In the following paragraphs, the third compressing unit 161 and the fourth compressing unit 162 will be explained in detail.

The fourth compressing unit 162 receives the input of the input data 200 from the second compressing unit 152. After that, the fourth compressing unit 162 generates the hash table 142 into the compression-purpose information storage unit 14.

Figure 13:
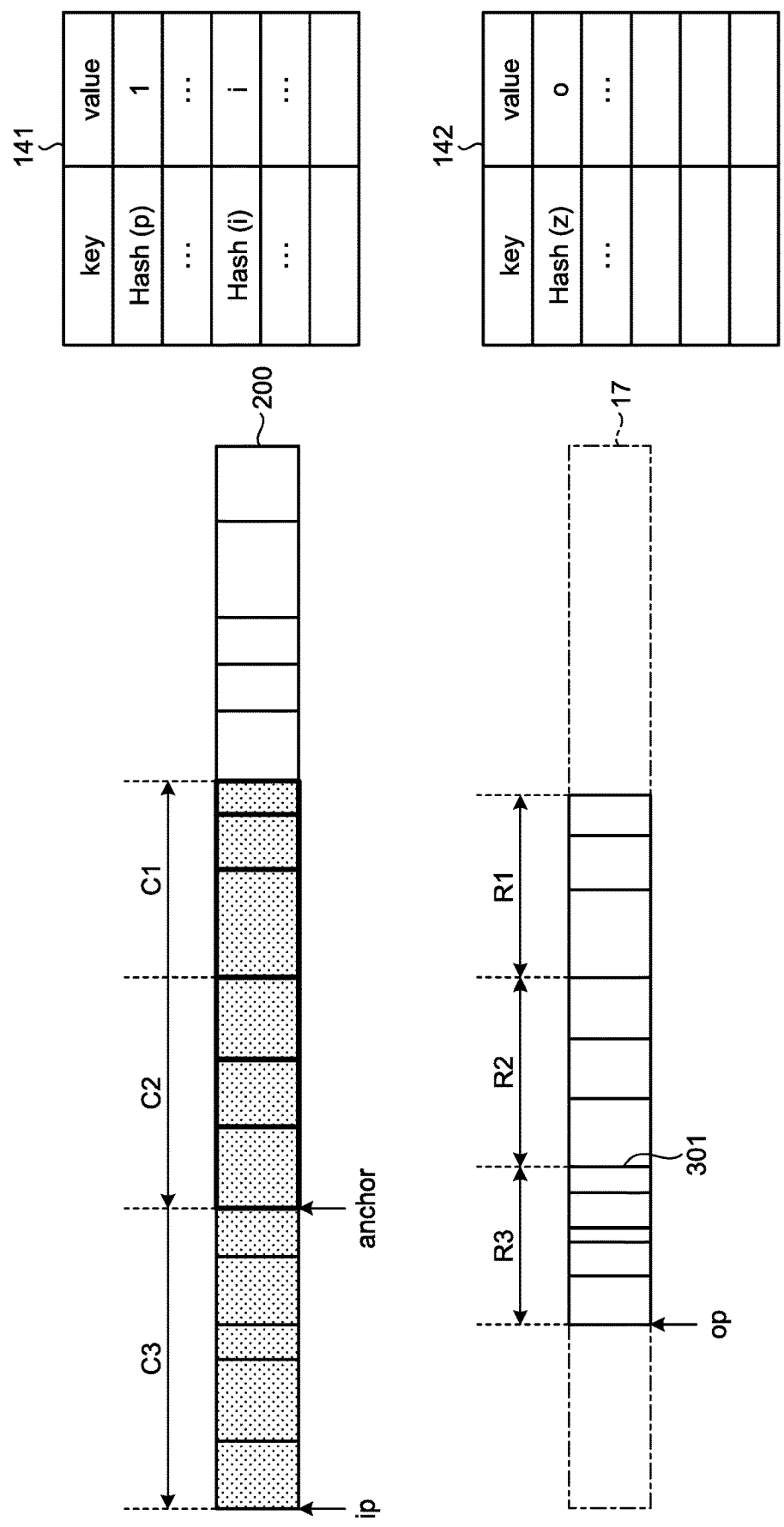
FIG. 13 is a drawing illustrating a compressed state realized by a fourth compressing unit.

FIG. 13 is a drawing illustrating a compressed state realized by the fourth compressing unit. The fourth compressing unit 162 performs a compressing process C3 starting from the positions of the anchor pointer, the ip pointer, and the op pointer at this point in time toward the head of the input data 200. In the compressing process C3, the fourth compressing unit 162 judges from the hash table 141 and the hash table 142 whether or not there is a value corresponding to the hashing result of the data indicated by the ip pointer. In other words, the fourth compressing unit 162 also uses the data in the common part for the matching process of the compression target data. With this arrangement, it is possible to properly decompress the compressed data generated in the compressing process C3, by decompressing the compressed data together with the pieces of data generated in the compressing processes C1 and C2.

When the value corresponding to the hashing result of the data indicated by the ip pointer is not present in the hash table 141 or 142, the fourth compressing unit 162 registers a key and a value corresponding to the hashing result of the data indicated by the ip pointer into the hash table 142. When the value corresponding to the hashing result of the data indicated by the ip pointer is present, the fourth compressing unit 162 performs the process corresponding to the matching situation in the same manner as the second compressing unit 152 did. The fourth compressing unit 162 performs the compressing process C3 up to the head of the input data 200.

In this manner, the fourth compressing unit 152 performs the compressing process C3 starting from the end on the head side of the common region in the input data 200 toward the head. After that, the fourth compressing unit 162 arranges the compressed data of the data from the end on the head side of the common, region, in the input data 200 to the head, into a region R3 of the compression buffer 17 and thus ends the compressing process C3. When having finished the compressing process C3, the fourth compressing unit 162 outputs the input data 200 to the third compressing unit 161.

Figure 14:
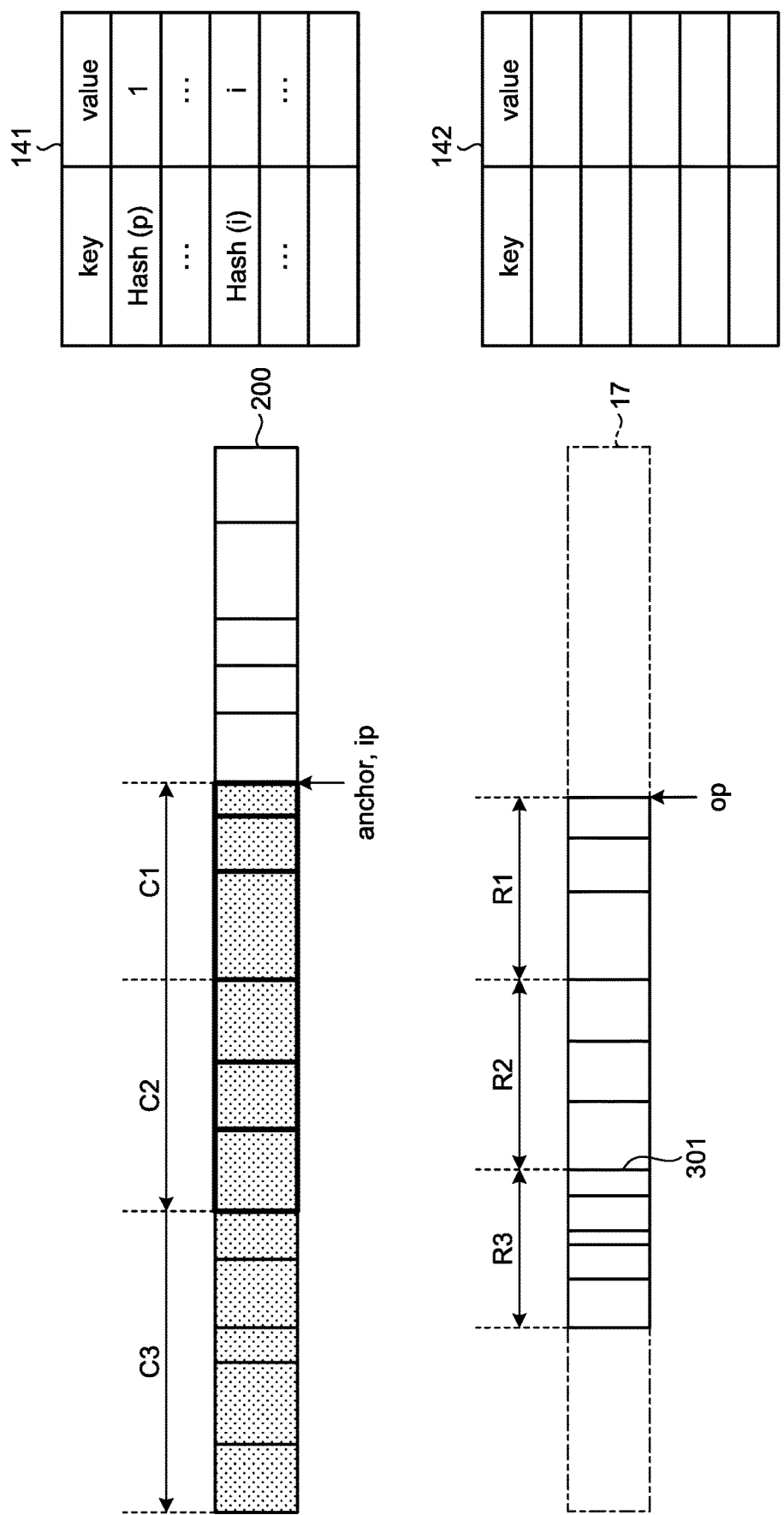
FIG. 14 is a drawing illustrating a state at the start of a compressing process performed by a third compressing unit.

The third compressing unit 161 receives the input of the input data 200 from the fourth compressing unit 162. FIG. 14 is a drawing illustrating a state at the start of the compressing process performed by the third compressing unit. The third compressing unit 161 sets the anchor pointer and the ip pointer at the end of the common region positioned on the tail end side of the input, data 200. Further, the third compressing unit 161 sets the op pointer to the end of the region R1 positioned on the tail end side of the compression buffer 17. Further, the third compressing unit 161 clears the information registered in the hash table 142.

Figure 15:
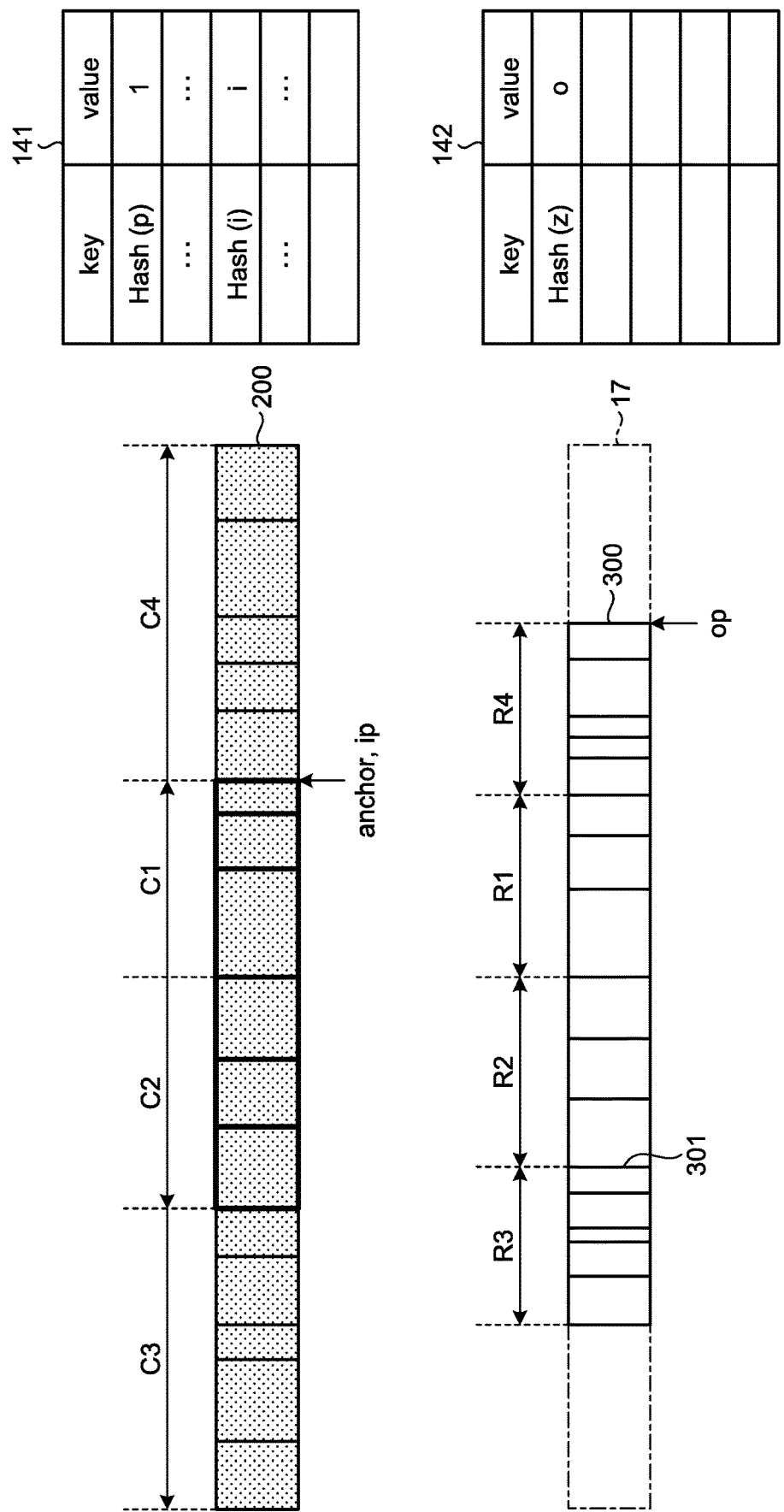
FIG. 15 is another drawing illustrating the state at the start of the compressing process performed by the third compressing unit.

The third compressing unit 161 performs a compressing process C4 starting from the positions of the anchor point, the ip pointer, and the op pointer toward the tail end of the input data 200. FIG. 15 is another drawing illustrating the state at the start of the compressing process performed by the third compressing unit. In the compressing process C4, the third compressing unit 161 judges from the hash table 141 and the hash table 142 whether or not there is a value corresponding to the hashing result of the data indicated by the ip pointer. In other words, the third compressing unit 161 also uses the data in the common part for the matching process with the compression target data. However, because the information that had been registered in the hash table 142 was cleared before performing the compressing process C4, the data compressed in the compressing process C3 is not used for the matching process. With this arrangement, it is possible to properly decompress the compressed data generated in the compressing process C4, by decompressing the compressed data together with the pieces of data generated in the compressing processes C1 and C2.

When the value corresponding to the hashing result of the data indicated by the ip pointer is not present in the hash table 141 or 142, the third compressing unit 161 registers a key and a value corresponding to the hashing result of the data indicated by the ip pointer, into the hash table 142. When the value corresponding to the hashing result of the data indicated by the ip pointer is present, the third compressing unit 161 performs the process in the matching situation in the same manner as the first compressing unit 151 did. The third compressing unit 161 performs the compressing process C4 up to the tail end of the input data 200.

In this manner, the third compressing unit 161 performs the compressing process C4 starting from the end, on the tail end side, of the common region in the input data 200 toward the tail end. Further, the third compressing unit 161 arranges the compressed data of the data from the end, on the tail end side, of the common region in the input data 200 to the tail end, into the region R4 of the compression buffer 17 and thus ends the compressing process C4. The compressed data 300 has thus been completed. When having finished the compressing process C4, the fourth compressing unit 162 outputs a notification indicating that the compressing process has been finished, to a first re-compressing unit 181 of the re-compressing unit 18.

The re-compressing unit 18 judges whether or not predictions about the compression ratios of the first compressing unit 151 and the second compressing unit 152 are found to be incorrect. When the predictions are found to be incorrect, the re-compressing unit 18 performs a compressing process again. In the following paragraphs, the first re-compressing unit 181 and a second re-compressing unit 182 will be explained in detail.

The first re-compressing unit 181 receives the input of the notification from the fourth compressing unit 162 indicating that the compressing process has been finished. After that, the first re-compressing unit 181 judges whether or not the sum of the sizes of the regions R1, R2, and R3 of the compressed data 300 stored in the compression buffer 17 exceeds 4 KB.

Figure 16:
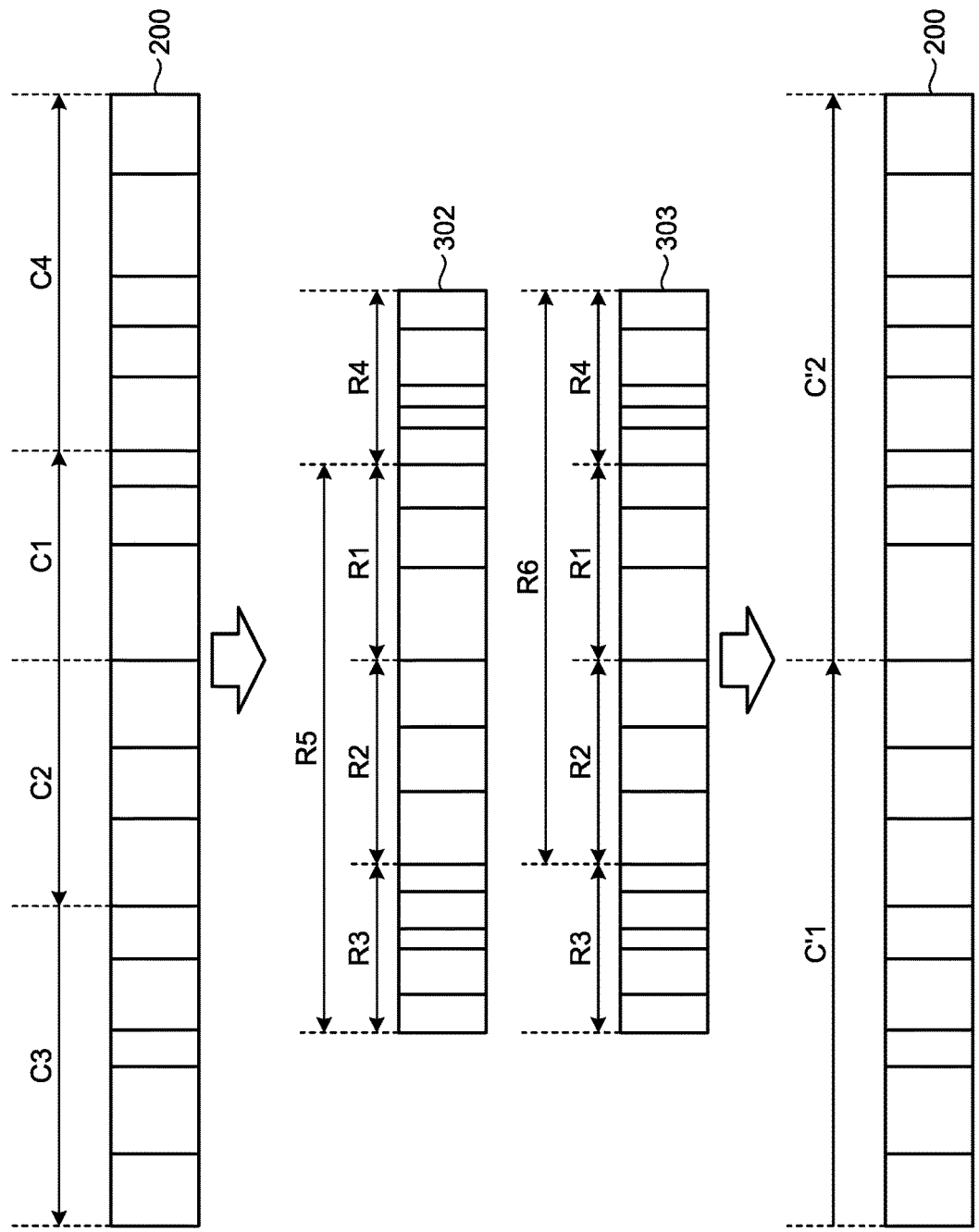
FIG. 16 is a drawing for explaining a re-compressing process performed on input data by a re-compressing unit according to the first embodiment.

FIG. 16 is a drawing for explaining the re-compressing process performed on the input data by the re-compressing unit according to the first embodiment. In the present example, it is assumed that compressed data 302 has been generated as a result of the compressing process performed on the input data 200 by the common region compressing unit 15 and the individual region compressing unit 16.

In this situation, the first re-compressing unit 181 judges whether or not the size of a region R5 in the compressed data 302 exceeds 4 KB. When the size of the region R5 exceeds 4 KB, it means that the prediction about the compression ratio of the first compressing unit 151 was incorrect. In that situation, even when the 4-KB data was read and decompressed from the head of the compressed data 302, the data would not accurately be decompressed, because a part of the data in the region R1 would fail to be read.

To cope with this situation, the first re-compressing unit 181 discards the compressed data 300 stored in the compression buffer 17. Further, the first re-compressing unit 181 clears the information registered in the hash tables 141 and 142. After that, the first re-compressing unit 181 performs a compressing process C'1 on the section from the head of the input data 200 to the center position, by using the hash table 141. In that situation, because the hash table 141 has no other information registered therein, the first re-compressing unit 181 checks whether or not the values match only among the pieces of data that are subject to the compressing process C'1. Subsequently, the first re-compressing unit 181 performs a compressing unit C'2 on the section from the center position of the input data 200 to the tail end. In that situation also, because the hash table 142 has no other information registered therein, the first re-compressing unit 181 checks whether or not the values match only among the pieces of data that are subject to the compressing process C'2. In other words, the first re-compressing unit 181 divides the input data 200 into sections of former half data and latter half data and performs the normal compressing process on each of the sections of data. After that, the first re-compressing unit 181 outputs a notification indicating that the re-compressing process is completed, to the storing processing unit 19.

On the contrary, when the size of the region R5 is equal to or smaller than 4 KB, it means that the prediction about the compression ratio of the first compressing unit 151 was correct. In that situation, the first re-compressing unit 181 outputs a notification indicating that the compressing process was normal to the second re-compressing unit 182.

The second re-compressing unit 182 receives the input of the notification about the compressing process being normal from the first re-compressing unit 181. After that, the second re-compressing unit 182 judges whether or not the sum of the sizes of the regions R1, R2, and R3 of the compressed data 300 stored in the compression buffer 17 exceeds 4 KB. In the present example, it is assumed that compressed data 303 illustrated in FIG. 16 has been generated as a result of the input data 200 being compressed by the common region compressing unit 15 and the individual region compressing unit 16.

In this situation, the second re-compressing unit 182 judges whether or not the size of a region R6 in the compressed data 303 exceeds 4 KB. When the size of the region R6 exceeds 4 KB, it means that the prediction about the compression ratio of the second compressing unit 152 was incorrect. In that situation, even when the 4-KB region was read and decompressed from the head of the region R2 toward the tail end of the compressed data 303, the data would not accurately be decompressed, because a part of the data in the region R4 would fail to be read.

To cope with this situation, the second re-compressing unit 182 discards the compressed data 300 stored in the compression buffer 17. Further, the second re-compressing unit 182 clears the information registered in the hash tables 141 and 142. After that, the second re-compressing unit 182 performs the compressing processes C'1 and C'2 in the same manner as the first compressing unit 151 did. Subsequently, the second re-compressing unit 182 outputs a notification indicating that the re-compressing process is completed, to the storing processing unit 19.

On the contrary, when the size of the region R6 is equal to or smaller than 4 KB, it means that the prediction about the compression ratio of the first compressing unit 151 was correct. In that situation, the second re-compressing unit 182 outputs a notification indicating that the compressing process was normal to the storing processing unit 19.

When having received the input of the notification from the second re-compressing unit 182 indicating that the compressing process was normal, the storing processing unit 19 obtains the compressed data 300 from the compression buffer 17. After that, the storing processing unit 19 stores the obtained compressed data 300 into the storage unit 30. Subsequently, the storing processing unit 19 stores information indicating an overlap compressing process, which is a compressing process using the common region, into a predetermined location in the reserved region of the meta data 143, for example. Further, the storing processing unit 19 stores the data head sector address in the storage unit 30 at which the compressed data 300 is stored, into a head address storing region 311 of the meta data 143. Further, the storing processing unit 19 stores an offset of the position in which the region 301 is stored in the compressed data 300 within the storage unit 30 from the data head sector address of the compressed data 300, into the offset storing region 312. The offset of the position in which the region 301 is stored, from the data head sector address of the compressed data 300 corresponds to the "second relative distance".

Further, when having received the input of the notification from either the first re-compressing unit 181 or the second re-compressing unit 182 indicating that the re-compressing process is completed, the storing processing unit 19 obtains the compressed data 300 from the compression buffer 17. After that, the storing processing unit 19 stores the obtained compressed data 300 into the storage unit 30. Subsequently, the storing processing unit 19 stores information indicating the dividing compressing process by which the input data 200 was divided into the sections of the former half data and the latter half data and compressed, into a predetermined location in the reserved region, of the meta data 143, for example. Further, the storing processing unit 19 stores the data head sector address in the storage unit 30 at which the compressed data 300 is stored, into the head address storing region 311 of the meta data 143. Furthermore, the storing processing unit 19 stores an offset of the center position of the compressed data 300 within the storage unit 30 from the data head sector address of the compressed data 300, into the offset storing region 312.

The reading unit 20 receives an input of an instruction to read 4-KB data from the transmitting and receiving unit 11. After that, the reading unit 20 refers to the meta data 143 managing the designated 4-KB data. Subsequently, the reading unit 20 obtains information about the compressing method for the designated 4-KB data from, the meta data 143.

When the compressing method is the overlap compressing method, the reading unit 20 obtains the data head sector address and the offset from the head address storing region 311 and the offset storing region 312 of the meta data 143, respectively. Subsequently, the reading unit 20 judges whether the designated 4-KB data is the former half data or the latter half data of the 8-KB data managed by the meta data 143.

Figure 17:
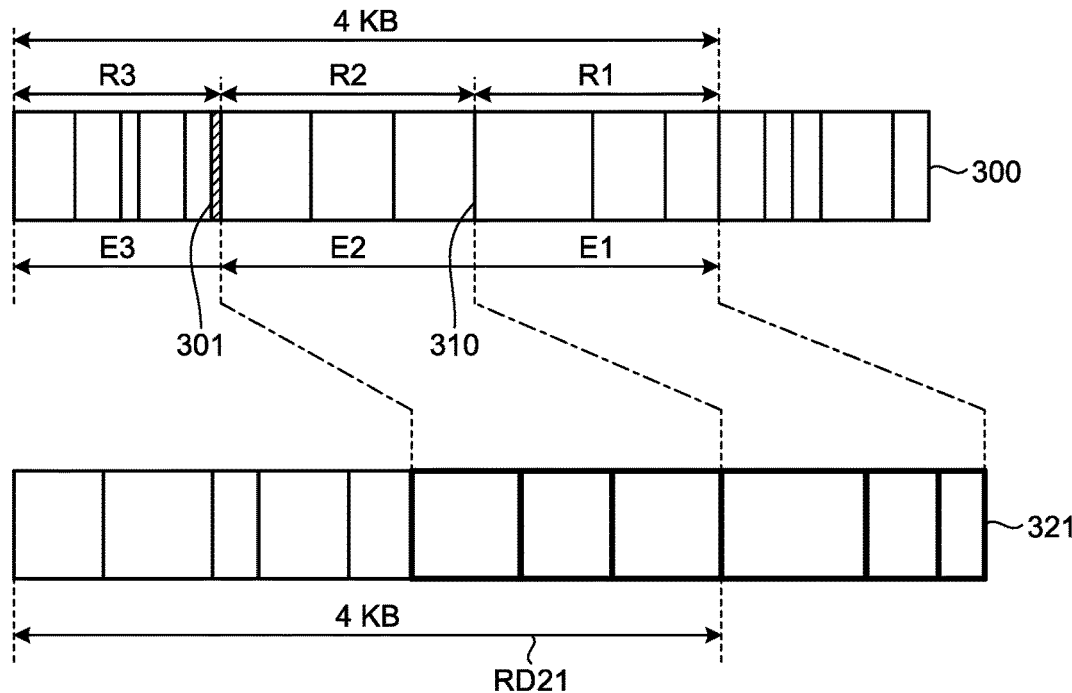
FIG. 17 is a drawing for explaining a decompressing process performed on former half data.

When the designated 4-KB data is the former half data, as illustrated in FIG. 17, the reading unit 20 reads, from the storage unit 30, the section corresponding to 4 KB from the head of the compressed data 300, out of the 8-KB data managed fay the meta data 143, by using the obtained data head sector address. FIG. 17 is a drawing for explaining a decompressing process performed on the former half data. In this situation, FIG. 17 illustrates an example in which the data obtained by connecting together the regions R1, R2, and R3 is data having a size of exactly 4 KB. In actuality, however, the data obtained by connecting together the regions R1, R2, and R3 may be smaller than 4-KB data. In that situation, the reading unit 20 reads, from the storage unit 30, extra data positioned behind the region R1 so as to obtain 4-KB data from the head.

Subsequently, the reading unit 20 identifies the region 301 of the compressed data that was read, by using the offset. After that, the reading unit 20 obtains the offset from the identified region 301 to the center position. Subsequently, the reading unit 20 identifies a center position 310 by adding the obtained offset to the center position to the head of the region R2.

After that, the reading unit 20 performs a decompressing process E1 while reading the data starting from the center position 310 toward the tail end of the region R1. When the decompressing process E1 is completed, the reading unit 20 performs a decompressing process E2 starting from the center position 310 toward the head of the region R2. In this situation, to perform the decompressing process E2, the reading unit 20 also uses the data that was generated by decompressing the region R1 through the already-completed decompressing process E1. After that, when the decompressing process E2 is completed, the reading unit 20 performs a decompressing process S3 starting from the head of the region R2 toward the head of the region R3. In this situation, to perform the decompressing process E3, the reading unit 20 also uses the data that was generated by decompressing the region R1 through the already-completed decompressing process E1 and the data that was generated by decompressing the region R2 through the already-completed decompressing process B2. As a result, the reading unit 20 has obtained decompressed data 321.

Subsequently, the reading unit 20 obtains data RD 21 by reading 4-KB data starting from the head of the decompressed data 321. The data RD 21 corresponds to the data designated in the read instruction. Alternatively, by using another method, because literal lengths are successively present at the boundary of the region R2 and the region R1, the reading unit 20 is also able to obtain the data RD21 designated by the read instruction, by decompressing and obtaining the data up to the position where the literal lengths are successively present.

Figure 18:
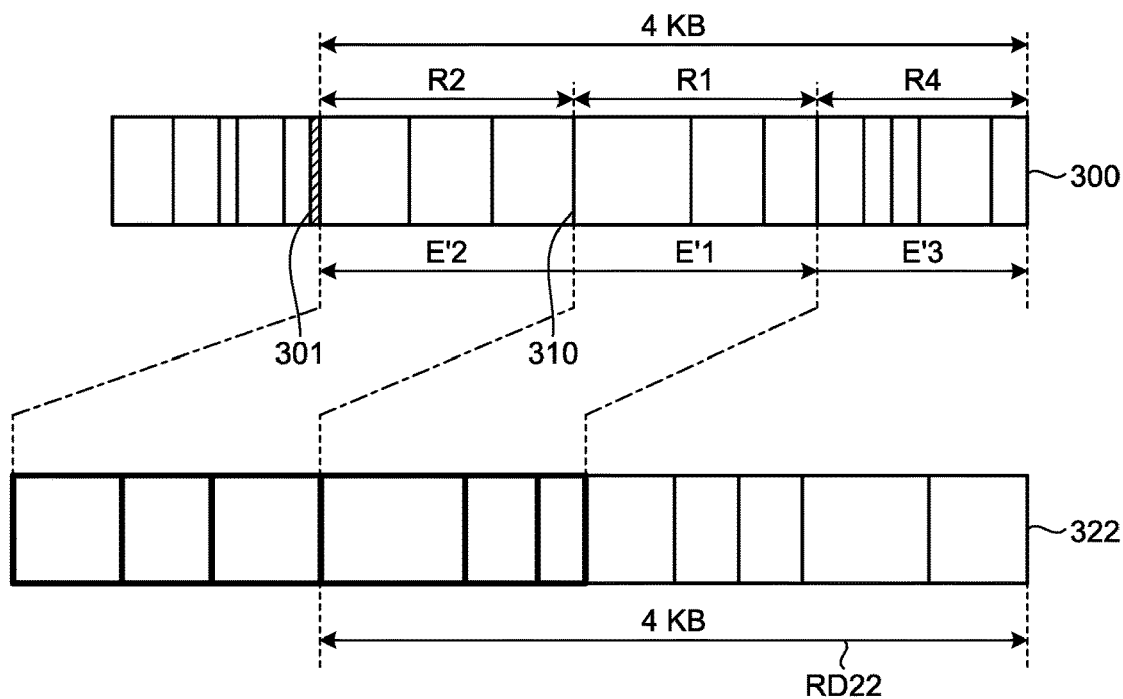
FIG. 18 is a drawing for explaining a decompressing process performed on latter half data.

On the contrary, when the designated 4-KB data is the latter half data, the reading unit 20 identifies the position of the region 301 by adding the obtained offset to the obtained data head sector address. Subsequently, as illustrated in FIG. 18, the reading unit 20 reads, from the storage unit 30, the section corresponding to 4 KB from the tail end of the position, of the region 301 in the compressed data 300, out of the 8-KB data managed by the meta data 143. FIG. 18 is a drawing for explaining the decompressing process performed on the latter half data. In this situation, FIG. 18 illustrates an example in which the data obtained by connecting together the regions R1, R2, and R3 is data having a size of exactly 4 KB. In actuality, however, the data obtained by connecting together the regions R1, R2, and R3 may be smaller than 4-KB data. In that situation, the reading unit 20 reads, from the storage unit 30, the data from the tail end of the position of the region 301 to the tail end of the compressed data 300 that has a size smaller than 4 KB.

Subsequently, the reading unit 20 identifies the center position 310 while using an offset, by adding the offset to the center position stored in the region 301 to the head of the compressed data that was read. After that, the reading unit 20 performs a decompressing process E'1 while reading the data starting from the center position 310 toward the tail end of the region R1. When the decompressing process E'1 is completed, the reading unit 20 performs a decompressing process E'2 starting from the center position 310 toward the head of the region R2. In this situation, to perform the decompressing process E'2, the reading unit 20 also uses the delta that was generated by decompressing the region R1 through the already-completed decompressing process E'1. After that, when the decompressing process E'2 is completed, the reading unit 20 performs a decompressing process E'3 starting from the head of the region R2 toward the head of the region R3. In this situation, to perform the decompressing process E'3, the reading unit 20 also uses the data that was generated by decompressing the region R1 through the already-completed decompressing process E'1 and the data that was generated by decompressing the region R2 through the already-completed decompressing process E'2. As a result, the reading unit 20 has obtained decompressed data 322.

Subsequently, the reading unit 20 obtains data RD22 by reading 4-KB data starting from the tail end of the decompressed data 322. The data RD22 corresponds to the data designated by the read instruction. Alternatively, in this situation also, the reading unit 20 is able to obtain the data RD22 designated by the read instruction, by decompressing and obtaining the data up to the position where literal length are successively present.

In contrast, when the compressing method is a divided compressing method, the reading unit 20 obtains the data head sector address and the offset of the center position from the data head sector address of the compressed data 300, from the head address storing region 311 and the offset storing region 312 of the meta data 143, respectively. Subsequently, the reading unit 20 judges whether the 4-KB designated data is the former half data or the latter half data of the 8-KB data managed by the meta data 143.

After that, when the 4-KB designated data is the former half data, the reading unit 20 reads and decompresses the data from the head of the compressed data 300 to the center position. In contrast, when the 4-KB designated data is the latter half data, the reading unit 20 reads and decompresses the data from the center position to the tail end of the compressed data 300. As a result, the reading unit 20 obtains the data designated by the read instruction.

After that, the reading unit 20 outputs the obtained decompressed data to the transmitting and receiving unit 11 as a response to the data read instruction. In this manner, when reading the data, the reading unit 20 is able to obtain the designated data, by reading and decompressing the data including the common region, regardless of whether the data to be read is the former half data or the latter half data. The reading unit 20 corresponds to an example of the "decompressing unit".

Figure 19:
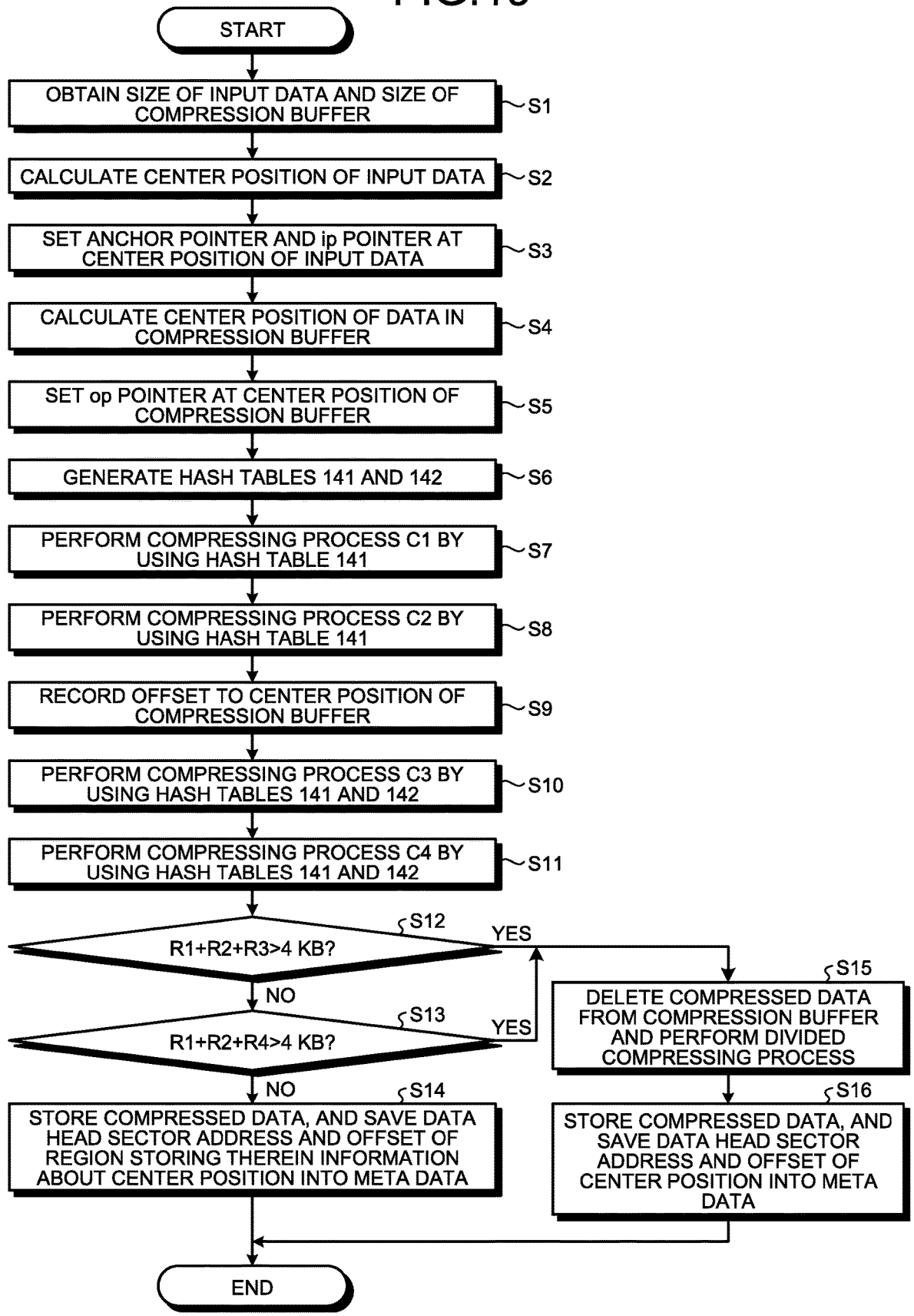
FIG. 19 is a flowchart illustrating a data overlap compressing process performed by the AFA according to the first embodiment.

Next, a flow in a data overlap compressing process performed by the AFA 1 according to the first embodiment will be explained with reference to FIG. 19. FIG. 19 is a flowchart illustrating the data overlap compressing process performed by the AFA according to the first embodiment.

The transmitting and receiving unit 11 receives the input data 200 from the server 2 together with a data store instruction. After that, the transmitting and receiving unit 11 outputs the size of the input data 200 to the specifying unit 12. Further, the transmitting and receiving unit 11 outputs the input data 200 to the first compressing unit 151. The specifying unit 12 obtains the size of the input data 200 from the transmitting and receiving unit 11. Further, the specifying unit 12 obtains the size of the compress ion buffer 17 from the compression buffer assigning unit 13 (step S1).

Subsequently, the specifying unit 12 calculates the center position of the input data 200 (step S2). After that, the specifying unit 12 outputs the information about the center position of the input data 200 to the first compressing unit 151.

The first compressing unit 151 receives the input of the input data 200 from the transmitting and receiving unit 11. Further, the first compressing unit 151 receives the input of the information about the center position of the input data 200 from the specifying unit 12. After that, the first compressing unit 151 sets the anchor pointer and the ip pointer at the center position of the input data 200 (step S3).

Subsequently, the specifying unit 12 calculates the center position 310 of the compression buffer 17 (step S4). After that, the specifying unit 12 outputs the information about the center position 310 of the compression buffer 17 to the first compressing unit 151.

The first compressing unit 151 receives the input of the information about the center position 310 of the compression buffer 17 from the specifying unit 12. After that, the first compressing unit 151 sets the op pointer at the center position 310 of the compression buffer 17 (step S5).

Subsequently, the first compressing unit 151 generates the hash table 141 into the compression-purpose information storage unit 14. Further, the fourth compressing unit 162 generates the hash table 142 into the compression-purpose information storage unit 14 (step S6).

Subsequently, the first compressing unit 151 performs the compressing process C1 by using the hash table 141 (step S7). After that, the first compressing unit 151 outputs the input data 200 with which the anchor pointer and the ip pointer have been arranged, to the second compressing unit 152.

Subsequently, the second compressing unit 152 performs the compressing process C2 by using the hash table 141 (step S8). After that, the second compressing unit 152 outputs the input data 200 with which the anchor pointer and the ip pointer have been arranged, to the fourth compressing unit 162.

Further, the second compressing unit 152 records the offset from the head of the already-compressed data to the center position 310 of the compression buffer 17, into the region 301 at the head of the already-compressed data (step S9).

Subsequently, the fourth compressing unit 162 performs the compressing process C3 by using the hash tables 141 and 142 (step S10). After that, the fourth compressing unit 162 outputs the input data 200 with which the anchor pointer and the ip pointer have been arranged, to the third compressing unit 161.

Subsequently, the third compressing unit 161 performs the compressing process C4 by using the hash tables 141 and 142 (step S11). After that, the third compressing unit 161 outputs a notification indicating that the compressing process is completed, to the re-compressing unit 18.

Subsequently, the re-compressing unit 18 judges whether or not the sum of the sizes of the regions R1, R2, and R3 exceeds 4 KB (step S12). When the sum of the sizes of the regions R1, R2, and R3 does not exceed 4 KB (step S12: No), the re-compressing unit 18 judges whether or not the sum of: the sizes of the regions of: R1, R2, and R4 exceeds 4 KB (step S13).

When the sum of the sizes of the regions R1, R2, and R4 does not exceed 4 KB (step S13: No), the re-compressing unit 18 outputs a notification indicating that the compressing process was normal to the storing processing unit 19. The storing processing unit 19 stores the compressed data 300 that is present in the compression buffer 17 into the storage unit 30 and further stores the data head sector address and the offset of the region 301 storing therein the information about the center position, into the meta data 143 (step S14).

On the contrary, when the sum of the sizes of the regions R1, R2, and R3 exceeds 4 KB (step S12: Yes) or when the sum of the sizes of the regions R1, R2, and R4 exceeds 4 KB (step S13: Yes), the re-compressing unit 18 deletes the compressed data 300 from the compression buffer 17. Further, the re-compressing unit 18 performs a divided compressing process by dividing the input data 200 into 4-KB sections of the former half data and the latter half data and performing a compressing process on each of the sections (step S15). After that, the re-compressing unit 18 outputs a notification indicating that the re-compressing process is completed, to the storing processing unit 13.

The storing processing unit 19 stores the data that resulted from the divided compressing process and is present in the compression buffer 17, into the storage unit and further stores the data head sector address and the offset of the center position into the meta data 143 (step S16).

FIG. 20 is a table illustrating a comparison of IOPS values and compression ratios at the time of reading observed when various compressing methods are used. When a whole compressing method is used to compress the entire 8-KB data of the input data 200, the IOPS at the time of reading 4-KB data is 285 K. In contrast, when the divided compressing method is used by which the input data 200 is compressed as being divided into the 4-KB sections of the former half data and the latter half data, the IOPS at the time of reading 4-KB data is 460 K. Further, when the overlap compressing method is used by which the compressing process is performed while using the common region, the IOPS at the time of reading 4-KB data is 460 K.

Further, when the whole compressing method is used, the compression ratio is good. When the divided compressing method is used, the compression ratio is not good. In contrast, the overlap compressing method is used, the compression ratio exhibits a value between the compression ratios of the whole compressing method and the divided compressing method, which is good to a certain degree. In this manner, when the overlap compressing method is used, it is possible to improve the IOPS at the time of reading in comparison to the situation where the whole compressing method is used, and it is also possible to improve the compression ratio in comparison to the situation where the divided compressing method is used.

As explained above, the AFA according to the first embodiment compresses the input data by using the common region in such a manner that, when the 4-KB data taken from the head or the tail end of the compressed data is decompressed, either the former half data or the latter half data is contained, with this arrangement, the compression ratio is improved because the compressing process is performed by using the piece of data that is larger than a half of the input data. Further, it is possible to obtain either the former half data or the latter half data by decompressing the 4-KB data taken from either the head or the tail end of the compressed data. Accordingly, because it is possible to reduce the reading of extra data, it is possible to improve the IOPS at the time of reading. In other words, the AFA according to the first embodiment is able to contribute to an improvement of the processing capability and the compression ratio.

Modification Examples

Figure 21:
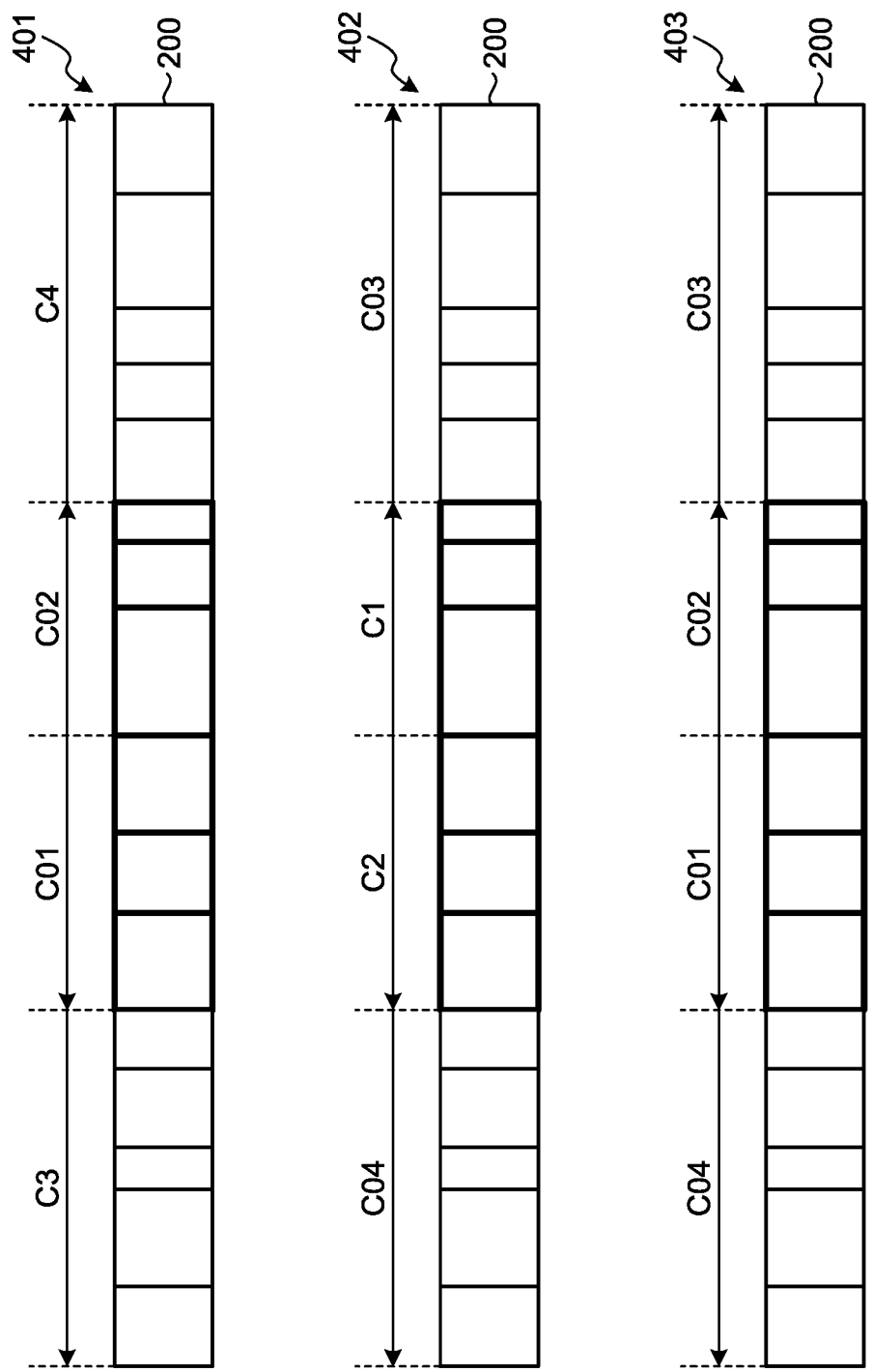
FIG. 21 is a drawing for explaining an order in which compressing processes are performed in a modification example of the first embodiment.

Next, a modification example of the first embodiment will be explained. The AFA 1 according to the present, modification example performs compressing process on the regions in an order different from that in the first embodiment. FIG. 21 is a drawing for explaining the order in which the compressing processes are performed in the modification example of the first embodiment.

For example, as illustrated in an example 401, the first compressing unit 151 performs a compressing process C01 starting from the center position of the input data 200 toward the head thereof, by using the hash table 141. Subsequently, by using the same hash table 141, the second compressing unit 152 performs a compressing process C02 starting from the center position of the input data 200 toward the tail end thereof. The fourth compressing unit 162 and the third compressing unit 161 perform the compressing process C3 and the compressing process C4, respectively, in the same manner as in the first embodiment. In this manner, the AFA 1 is able to perform the overlap compressing process even when the order in which the compressing processes C1 and C2 are performed on the common region is switched.

Further, as illustrated in another example 402, the first compressing unit 151 and the second compressing unit 152 perform the compressing processes C1 and C2, respectively, in the same manner as in the first, embodiment. After that, the fourth compressing unit 162 performs a compressing process C03 on the data from the tail end of the common region to the tail end of the input data 200, by using the hash tables 141 and 142. Further, the third compressing unit 161 performs a compressing process C04 on the data from the head of the common region to the head of the input data 200. In this manner, the AFA 1 is able to perform the overlap compressing process even when the order in which the compressing processes C3 and C4 are performed on the individual regions is switched.

Further, as illustrated in yet another example 403, the first compressing unit 151 performs the compressing process C01 starting from the center position of the input data 200 toward the head thereof, by using the hash table 141. Subsequently, by using the same hash table 141, the second compressing unit 152 performs the compressing process C02 starting from the center position of the input data 200 toward the tail end thereof. After that, the fourth compressing unit 162 performs the compressing process C03 on the data from the tail end of the common region to the tail end of the input data 200, by using the hash tables 141 and 142. Further, the third compressing unit 161 performs the compressing process C04 on the data from the head of the common region to the head of the input data 200. In this manner, the AFA 1 is able to perform the overlap compressing process even when the order in which the compressing processes C1 and C2 are performed on the common region is switched, and in addition, the order in which the compressing processes C3 and C4 are performed on the individual regions is switched.

As explained above, the AFA is able to perform an overlap compressing process in any order as long as the common region including the center position is compressed first, and subsequently, the compressing processes are performed on the individual regions, while also using the data in the common region. Accordingly, as long as the order in which the common region and the individual regions are compressed is maintained, the AFA is able to contribute to an improvement of the processing capability and the compression ratio, regardless of the order of the other compressing processes.

[b] Second Embodiment

Next, a second embodiment will be explained. The AFA according to the second embodiment is different from that in the first embodiment for being configured to utilize already-performed compressing processes at the time of performing a re-compressing process. The AFA according to the second embodiment is also illustrated in the block diagram in FIG. 1. In the following paragraphs, explanations of some of the operations of the functional units that are the same as those in the first embodiment will be omitted.

To perform the compressing process C1, the first compressing unit 151 generates a bash table 1411. After that, the first compressing unit 151 performs the compressing process C1 by using the hash table 1411 and generates the region R1 of the compressed data 300.

To perform the compressing process C2, the second compressing unit 152 generates a hash table 1412. After that, the second compressing unit 152 performs the compressing process C2 by using the hash tables 1411 and 1412 and generates the region R2 of the compressed data 300. In other words, in the second embodiment, the second compressing unit 152 performs the compressing process C2 by newly generating the hash table 1412 that is different from the hash table 1411 used by the first compressing unit 151.

Figure 22:
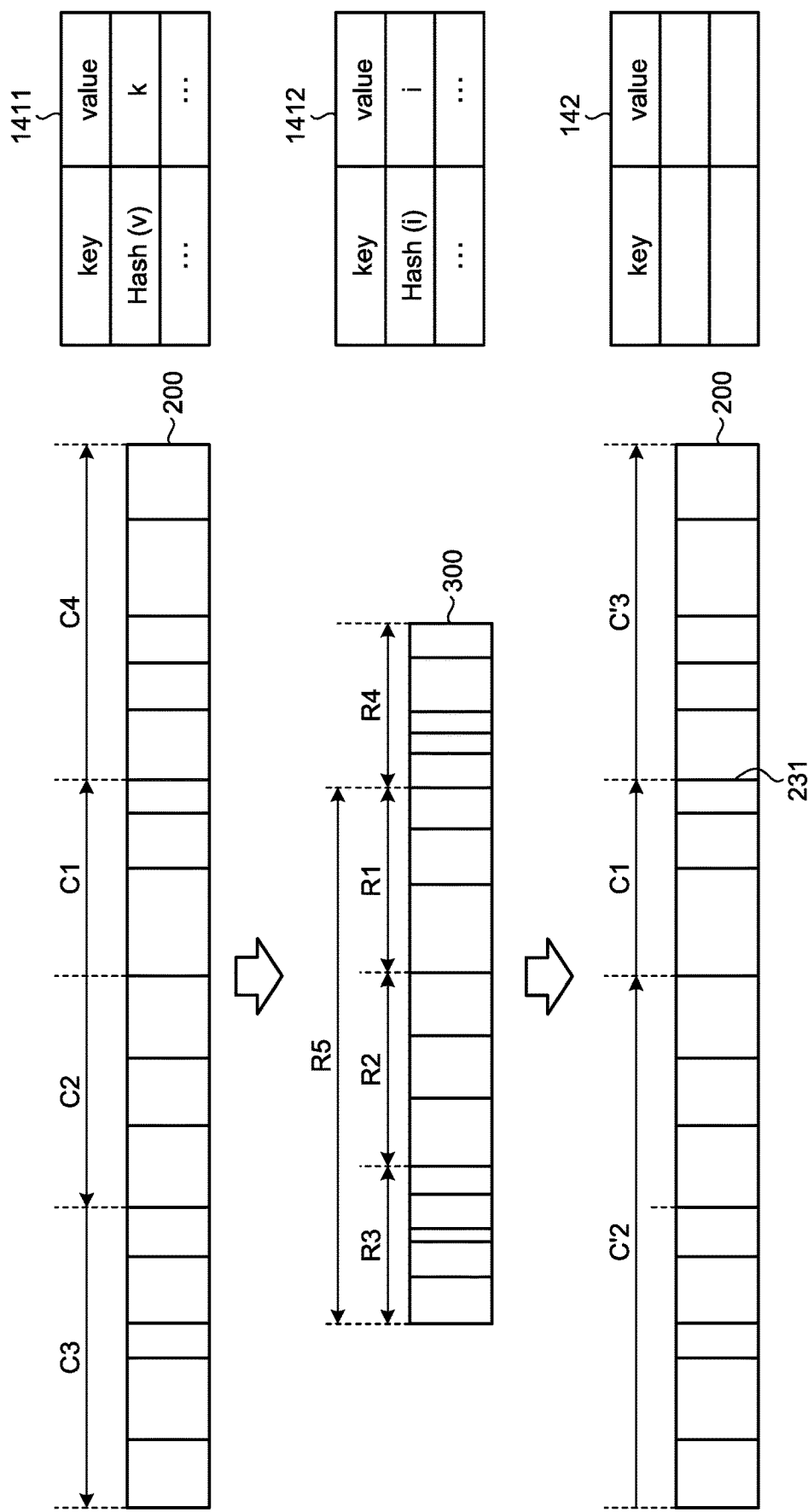
FIG. 22 is a drawing for explaining a re-compressing process performed on former half data according to a second embodiment.

The fourth compressing unit 162 and the third compressing unit 161 perform the compressing processes C3 and C4, respectively, by using the hash tables 1411, 1412, and 142. In this situation, the first compressing unit 151, the second compressing unit 152, the third compressing unit 161, and the fourth compressing unit 162 perform the compressing processes C1 to C4 on the input data 200 as illustrated in FIG. 22 and generate the compressed data 300. FIG. 22 is a drawing for explaining the re-compressing process performed on the former half data according to the second embodiment.

The first re-compressing unit 181 judges whether or not the size of the region R5 totaling the regions R1, R2, and R3 is larger than 4 KB. When the size of the region R5 totaling the regions R1, R2, and R3 is larger than 4 KB, the first re-compressing unit 181 discards the part of the compressed data 300 other than the region R1. Further, the first re-compressing unit 181 clears the information registered in the hash table 142.

After that, the first re-compressing unit 181 performs the compressing process C'2 on the former half data that is the 4-KB data in the former half of the input data 200, by using the hash table 142. In that situation, the first re-compressing unit 181 performs the compressing process C'2 by using only the former half data.

Subsequently, the first re-compressing unit 181 clears the registered contents of the hash table 142. After that, by using the hash tables 142 and 1411, the first re-compressing unit 181 performs the compressing process C'3 on the data from a position 231 to the tail end of the input data 200. In that situation, the first, re-compressing unit 181 performs the compressing process C'3 by also using the data used in the compressing process C1.

In this manner, the first re-compressing unit 181 is able to perform the re-compressing process on the input data 200 by omitting the compressing process on the region R1.

Figure 23:
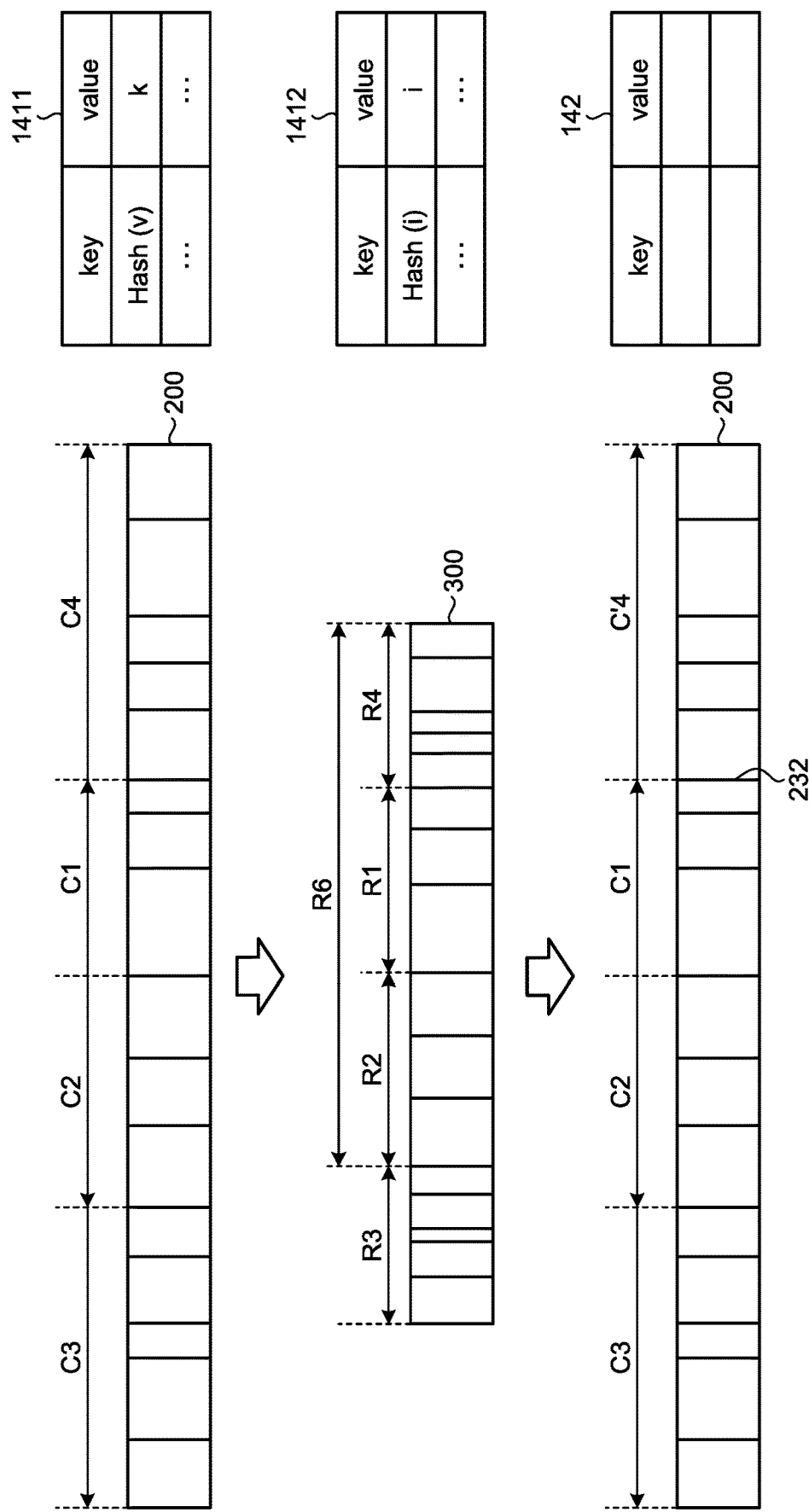
FIG. 23 is a drawing for explaining a re-compressing process performed on latter half data according to the second embodiment.

When having received the notification from the first re-compressing unit 181 that the compressing process was normal, the second re-compressing unit 182 judges whether or not the size of the region R6 totaling the regions R1, R2, and R4 illustrated in FIG. 23 is larger than 4 KB. FIG. 23 is a drawing for explaining the re-compressing process performed on the latter half data according to the second embodiment. When the size of the region R6 totaling the regions R1, R2, and R4 is larger than 4 KB, the second re-compressing unit 182 discards the region R4 of the compressed data 300. Further, the second re-compressing unit 182 clears the information registered in the hash table 142.

After that, the second re-compressing unit 182 performs the compressing process C'4 on the data from a position 232 to the tail end of the input data 200, by using the hash tables 142 and 1411. In that situation, to perform the compressing process C'4, the second re-compressing unit 182 also uses the data used in the compressing process C1.

In this manner, the second re-compressing unit 182 is able to perform the re-compressing process on the input data 200 while omitting the compressing processes on the regions R1, R2, and R3.

Figure 24:
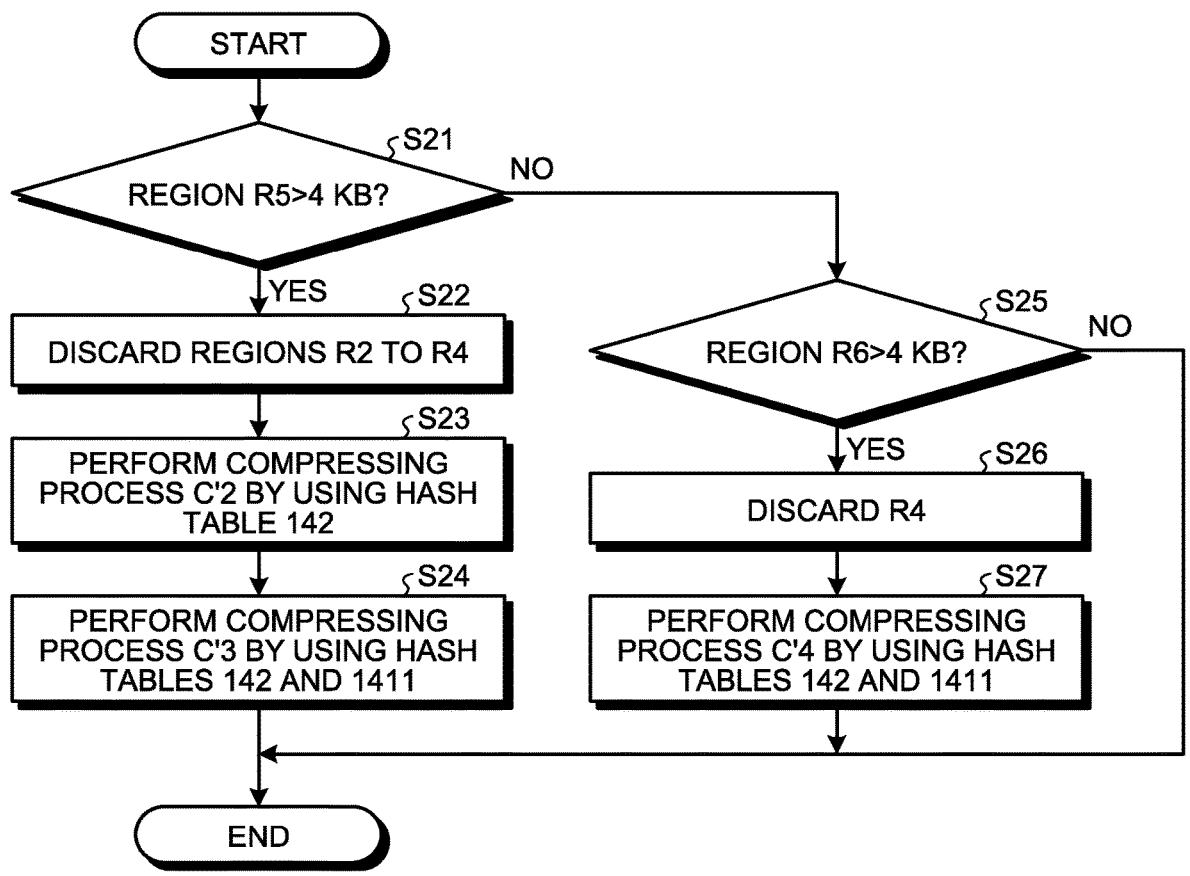
FIG. 24 is a flowchart illustrating a re-compressing process according to the second embodiment.

Next, a flow in a re-compressing process according to the second embodiment will be explained, with reference to FIG. 24. FIG. 24 is a flowchart illustrating the re-compressing process according to the second embodiment.

The first, re-compressing unit 181 judges whether or not the size of the region R5 is larger than 4 KB (step 321). When the size of the region R5 is larger than 4 KB (step S21: Yes), the first re-compressing unit 181 discards the regions R2 to R4 of the compressed data 300 (step S22). Further, the first re-compressing unit 181 clears the information registered in the hash table 142.

After that, the first re-compressing unit 181 performs the compressing process C2 by using the hash table 142 (step S23).

Subsequently, the first re-compressing unit 181 clears the registered contents of the hash table 142. After that, the first re-compressing unit 181 performs the compressing process C'3 by using the hash tables 142 and 1411 (step S24). After that, the first re-compressing unit 181 outputs a notification indicating that the re-compressing process is completed, to the storing processing unit 19 and thus ends the re-compressing process.

On the contrary, when the size of the region R5 is equal to or smaller than 4 KB (step S21: No), the first re-compressing unit 181 outputs a notification indicating that the compressing process was normal to the second re-compressing unit 182. When having received the notification from the first re-compressing unit 181 indicating that the compressing process was normal, the second re-compressing unit 182 judges whether or not the size of the region R6 is larger than 4 KB (step S25). When the size of the region R6 is equal to or smaller than 4 KB (step S25: No), the second re-compressing unit 182 outputs a notification indicating that the compressing process was normal, to the storing processing unit 19 and thus ends the re-compressing process.

On the contrary, when the size of the region R6 is larger than 4 KB (step S25: Yes), the second re-compressing unit 182 discards the region R4 of the compressed data 300. Further, the second re-compressing unit 182 clears the information registered in the hash table 142 (step S26).

After that, the second re-compressing unit 182 performs the compressing process C'4 by using the hash tables 142, 1411, and 1412 (step S27).

As explained above, the AFA according to the second embodiment is able to reduce the compressing processes during the re-compressing process. Accordingly, the AFA according to the second embodiment is able to further improve the processing capability.

[c] Third Embodiment

Next, a third embodiment will be explained. An AFA according to the third embodiment is different from that in the first embodiment for being configured to utilize already-performed compressing processes at the time of performing a decompressing process. The AFA according to the third embodiment is also illustrated in the block diagram in FIG. 1. In the following paragraphs, explanations of some of the operations of the functional units that are the same as those in the first embodiment will be omitted.

Figure 25:
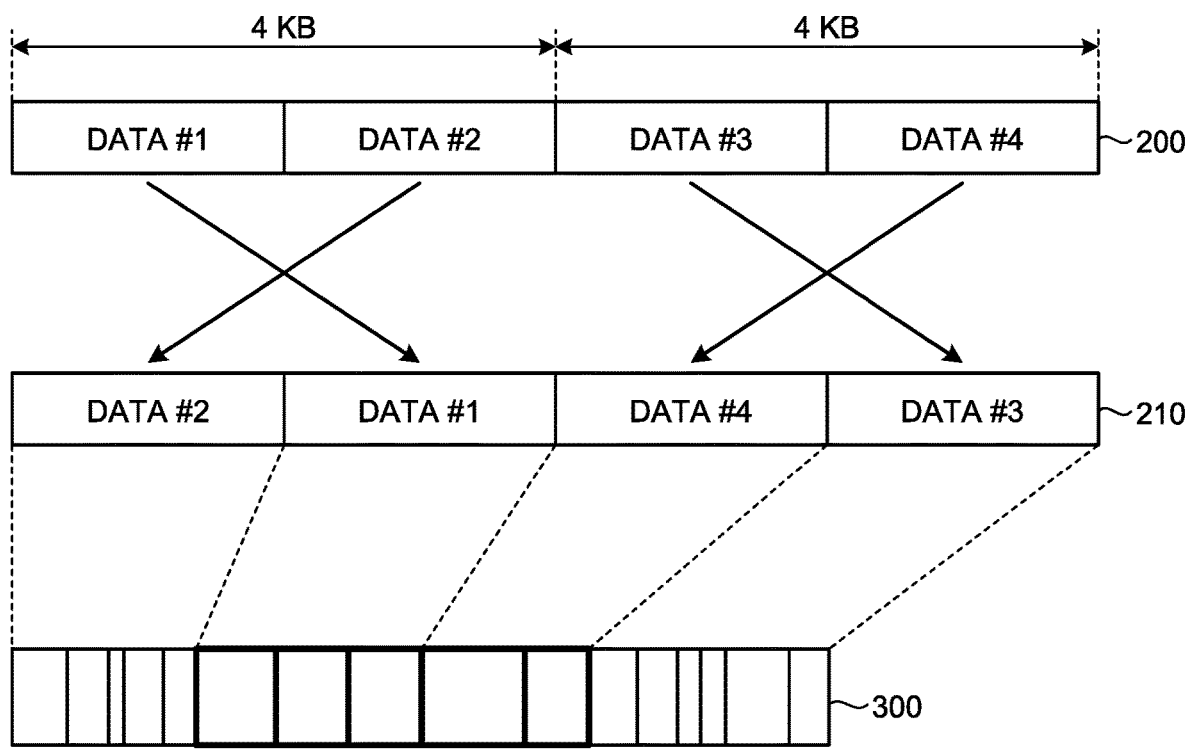
FIG. 25 is a drawing for explaining an outline of a compressing process performed by an AFA according to a third embodiment.

FIG. 25 is a drawing for explaining an outline of a compressing process performed, by the AFA according to the third embodiment. In the third embodiment, an example will be explained in which, as illustrated in FIG. 25, the input, data 200 includes pieces of data #1 to #4. The pieces of data #1 and #2 form 4-KB former half data. Further, the pieces of data #3 and #4 form 4-KB latter half data.

The first compressing unit 151 interchanges the pieces of data #1 and #2 in the input data 200. Further, the first compressing unit 151 interchanges the pieces of data #3 and #4 in the input data 200. As a result, the first compressing unit 151 generates data 210. After that, the first compressing unit 151 writes information about the interchanging of the data into a predetermined region in the reserved region, for example, of the meta data 14.

After that, the first compressing unit 151, the second compressing unit 152, the third compressing unit 161, and the fourth compressing unit 162 perform the compressing processes C1 to C4 on the data 210, respectively, so as to generate the compressed data 300.

After generating the data 210 by decompressing the compressed data 300, the reading unit 20 obtains the information about the interchanging of the data from the meta data 143. After that, the reading unit 20 generates the input data 200 by interchanging the data 210 according to the information about the interchanging of the data.

As explained above, the AFA according to the third embodiment generates the data obtained by interchanging the pieces of data that were input, performs the overlap compressing process on the generated data, and saves the result, into an SSD. In this manner, the AFA according to the third embodiment is able to perform the overlap compressing process even when the pieces of data that are input are interchanged. With this arrangement, it is possible to improve the compression ratio by, for example, moving such a part that contains a large amount of common data into the common region.

In the third embodiment, although the example is explained in which the former half data and the latter half data are interchanged with each other, possible data interchanging processes are not limited to this example. The first compressing unit 151 may perform any data interchanging process, as long as information about the data interchanging process that makes it possible to restore the input data is stored into the meta data.

[d] Fourth Embodiment

Figure 26:
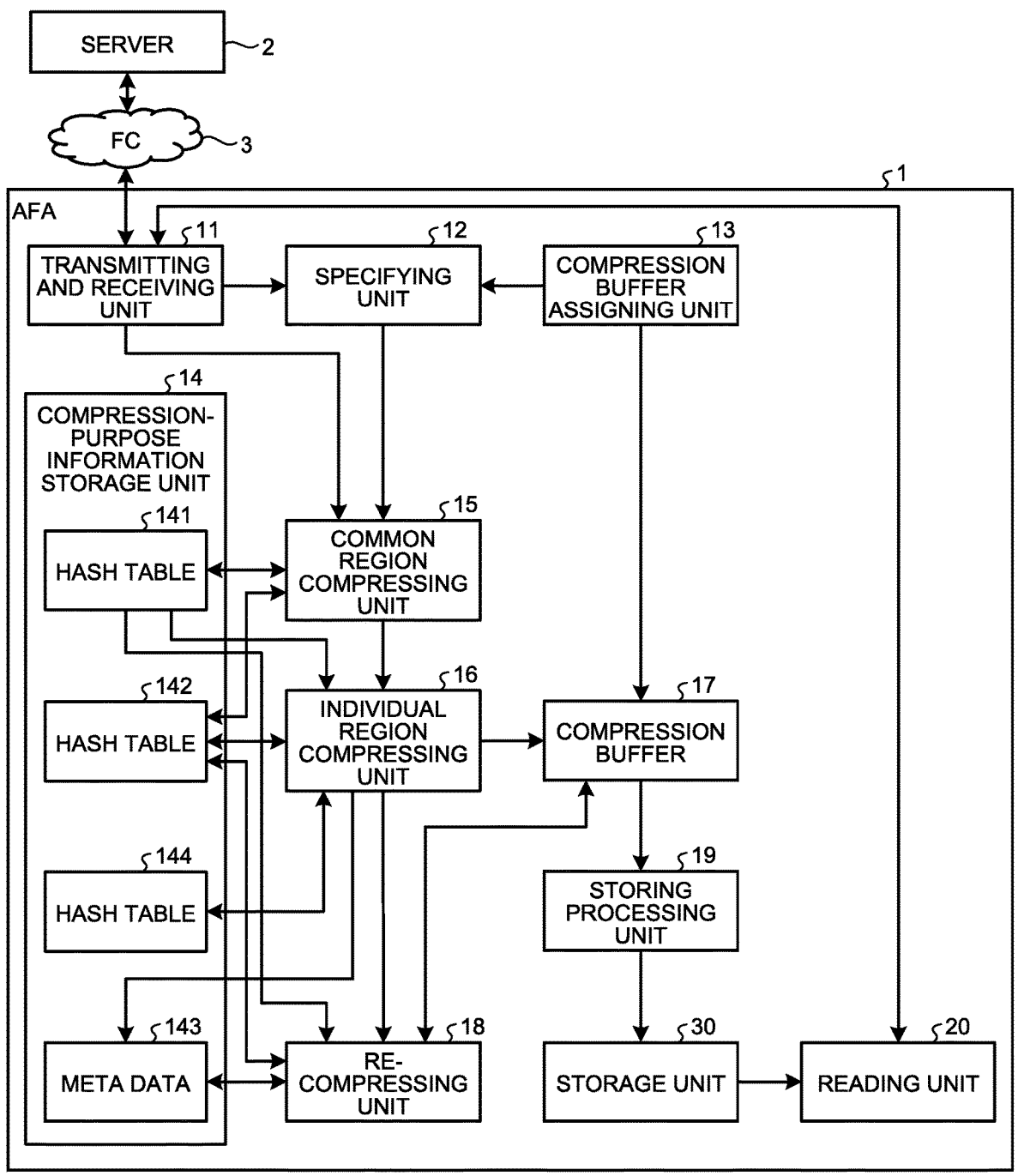
FIG. 26 is a block diagram of an AFA according to a fourth embodiment.

FIG. 26 is a block diagram of an AFA according to a fourth embodiment. The AFA 1 according to the fourth embodiment is different from that in the first embodiment for being configured to handle the input data 200 by dividing the input data 200 into three regions. In FIG. 26, some of the constituent elements that are referred to by using the same reference numerals as those in FIG. 1 have the same functions, unless particularly noted otherwise. In the following paragraphs, explanations of some of the operations of the functional units that are the same as those in the first embodiment will be omitted. In the fourth embodiment, an example will be explained in which the input data 200 managed by the meta data 143 is 12 KB, and the AFA 1 performs a compressing process so that it is possible to individually read each section when the input data 200 is divided into three sections of 4-KB data. The size 4 KB corresponds to an example of the "predetermined size".

Figure 27:
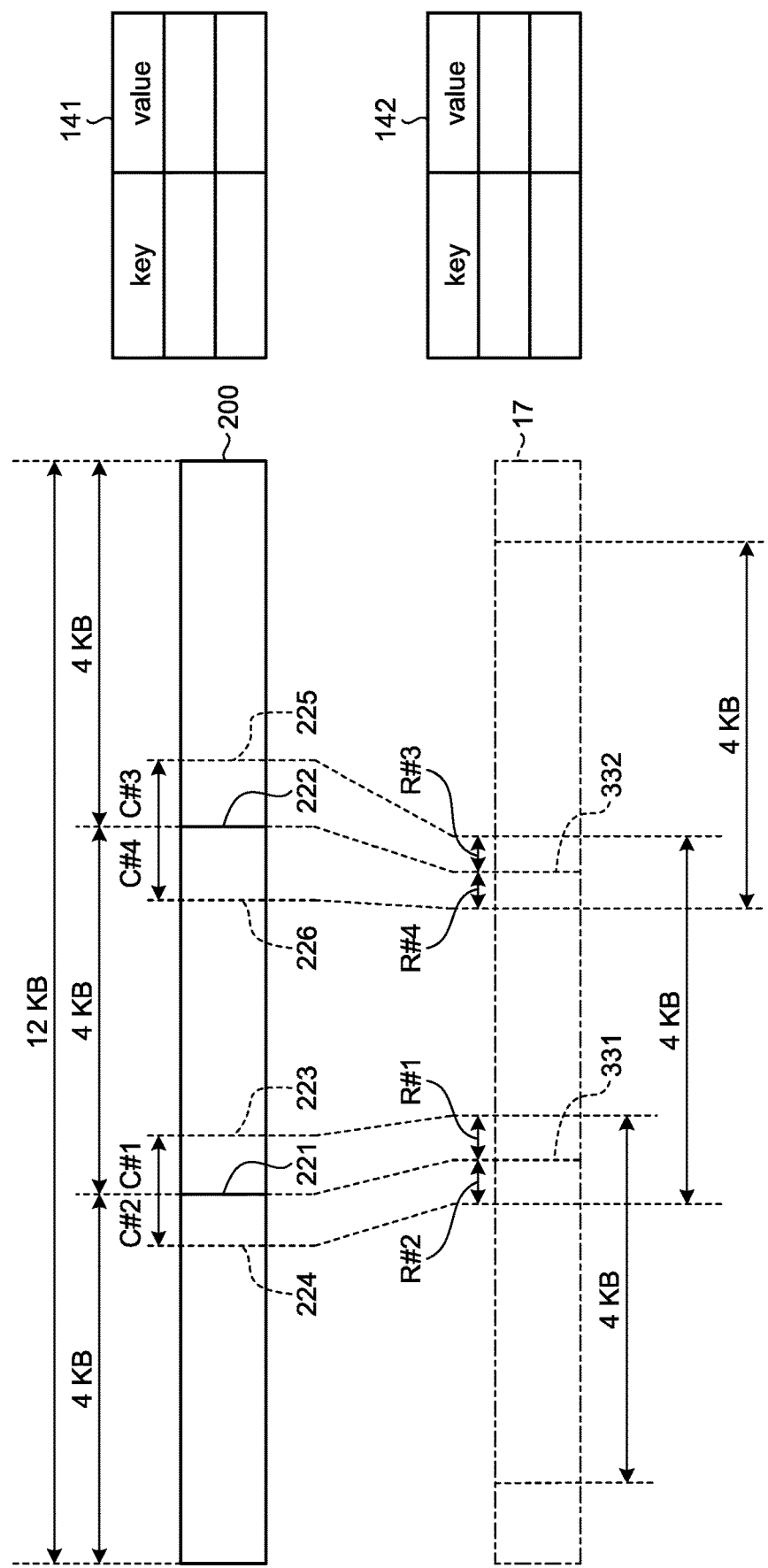
FIG. 27 is a drawing for explaining a compressing process performed by the AFA on a common region according to the fourth embodiment.

The specifying unit 12 specifies dividing positions 221 and 222 illustrated in FIG. 27 used for dividing the input data 200 into the three sections. Further, the specifying unit 12 also specifies positions 331 and 332 at which the size from the center position of the compression buffer 17 is equal to 2 KB and which are, located on either side thereof. In this situation, FIG. 27 is a drawing for explaining a compressing process performed by the AFA on a common region according to the fourth embodiment.

The common region compressing unit 15 receives an input, of the dividing positions 221 and 222, as well as the positions 331 and 332. The common region compressing unit 15 receives an input of the input data 200 from the transmitting and receiving unit 11. Subsequently, the common region compressing unit 15 generates the hash tables 141 and 142 into the compression-purpose information storage unit 14.

Subsequently, the common region compressing unit starts a compressing process C #1 from the dividing position 221 toward the tail end of the input data 200, by using the hash table 141. After that, the common region compressing unit 15 predicts as compression position 223 that can make the post-compression size of the data from the head of the input data 200 to the compression position 223 equal to 4 KB, by using the boundary judging expression $x' \geq 4c'/(4-c')$. After that, the common, region compressing unit 15 performs the compressing process C #1 up to the predicted compression position 223. As a result of the compressing process C #1, the common region compressing unit 15 stores the compressed data into a region R #1 of the compression buffer 17.

Subsequently, the common region compressing unit 15 starts a compressing process C #2 from the dividing position 221 toward the head of the input data 200, by using the hash table 141 that has registered therein keys and values from the compressing process C #1. After that, the common region compressing unit 15 predicts a compression position 224 that, can make the post-compression size of the data from the compression position 224 to a compression position 225 equal to 4 KB by using the boundary judging expression $x' \geq 4c'/(4-C)$. After that, the common region compressing unit 15 performs a compressing process C #2 up to the predicted compression position 224. As a result of the compressing process C #2, the common region compressing unit 15 stores the compressed data into a region R #2 of the compression buffer 17. Subsequently, at the head of the region R #2, the common region compressing unit 15 stores the offset from that position to a position 331.

Subsequently, the common region compressing unit starts a compressing process C #3 from the dividing position 222 toward the tail end of the input data 200 by using the hash table 142. After that, the common region compressing unit 15 predicts a compression position 225 that can make the post-compression size of the data from the compression position 224 to the compression position 225 equal to 4 KB by using the boundary judging expression $x' \geq 4c'/(4-c')$. After that, the common region compressing unit. 15 performs a compressing process C #3 up to the predicted compression position 225. As a result of the compressing process C #3, the common region compressing unit 15 stores the compressed data into a region R #3 of the compression buffer 17.

Subsequently, the common region compressing unit 15 starts a compressing process C #4 from the dividing position 222 toward the head of the input data 200, by using the hash table 142 that has registered therein keys and values from the compressing process C #3. After that, the common region compressing unit 15 predicts a compression position 226 that can make the post-compression size of the data from the compression position 226 to the tail end of the input data 200 equal to 4 KB by using the boundary judging expression $x' \geq 4c'/(4-c')$. After that, the common region compressing unit 15 performs the compressing process C #4 up to the predicted compression position 226. As a result of the compressing process C #4, the common region compressing unit 15 stores the compressed data into a region R #4 of the compression buffer 17.

Subsequently, at the head of the region R #4, the common region compressing unit 15 stores the offset from that position to the position 331. After that, the common region compressing unit 15 outputs the input data 200 to the individual region compressing unit 16.

When having received the input of the input data 200 from the common region compressing unit 15, the individual region compressing unit 16 generates a hash table 144.

Figure 28:
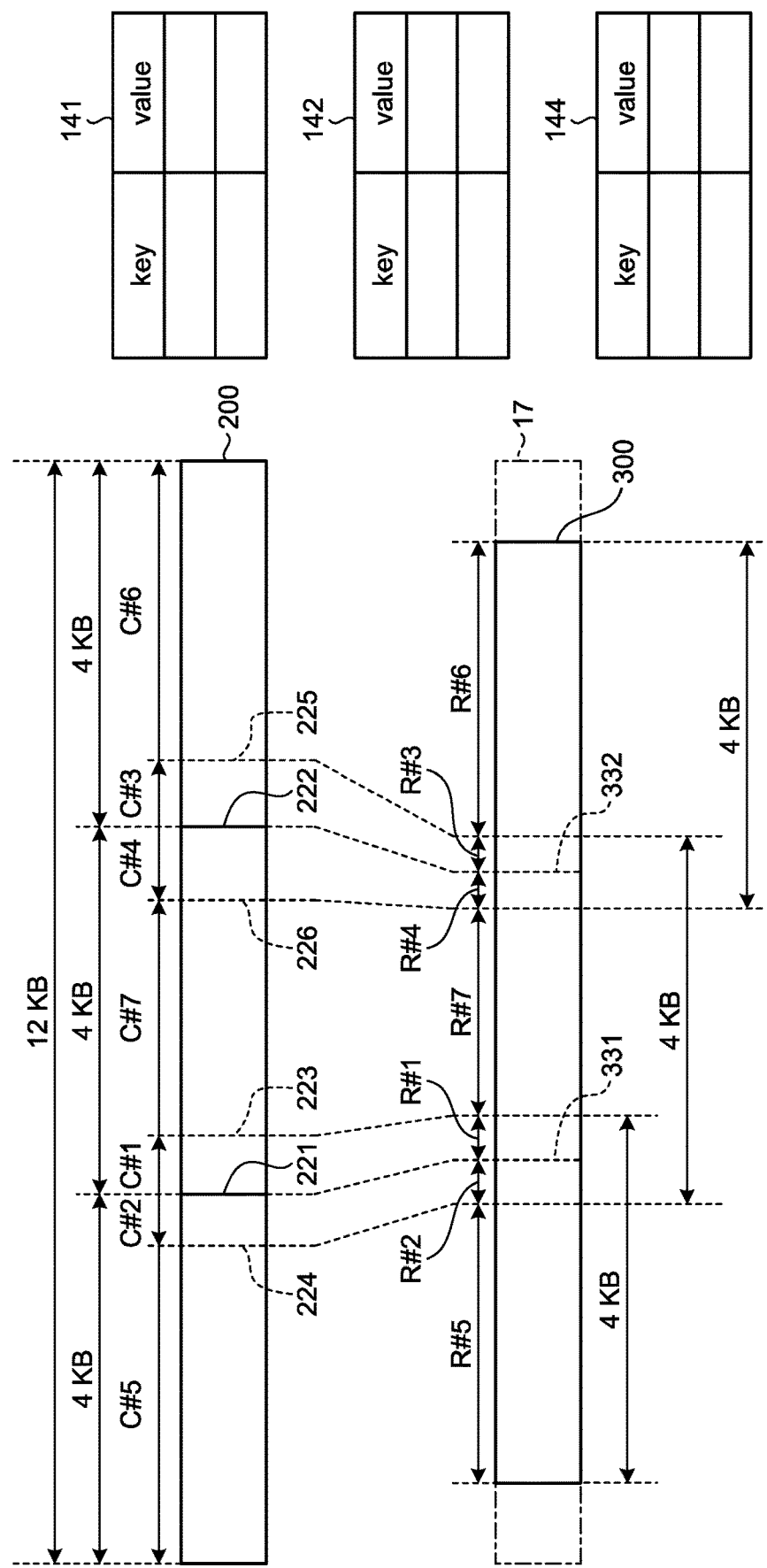
FIG. 28 is a drawing for explaining a compressing process performed by the AFA on individual regions according to the fourth embodiment.

Subsequently, as illustrated in FIG. 28, the individual region compressing unit 16 performs a compressing process C #5 on the data from the compression position 224 to the head of the input, data 200, by using the hash tables 141 and 144. FIG. 28 is a drawing for explaining the compressing process performed by the AFA on the individual regions according to the fourth embodiment. As a result of the compressing process C #5, the individual region compressing unit 16 stores the compressed data into a region R #5 of the compression buffer 17.

Subsequently, the individual region compressing unit 16 clears the information registered in the hash table 144. After that, the individual region compressing unit 16 performs a compressing process C #6 on the data from the compression position 225 to the tail end of the input data 200, by using the hash tables 142 and 144. As result of the compressing process C #6, the individual region compressing unit 16 stores the compressed data into a region R #6 of the compression buffer 17.

Subsequently, the individual region compressing unit 16 clears the information registered in the hash table 144. After that, the individual region compressing unit 16 performs a compressing process C #7 on the data from the compression position 223 to the compression position 225, by using the hash tables 141, 142, and 144. As a result of the compressing process C #7, the individual region compressing unit 16 stores the compressed data into a region R #7 of the compression buffer 17. Accordingly, the individual region compressing unit 16 generates the compressed data. After that, the individual region compressing unit 16 notifies the re-compressing unit 18 that the compressing process is completed.

The re-compressing unit 18 judges whether or not the sum of the sizes in a connected region of the regions R #1, R #2, and R #5, a connected region of the regions R #1, R #4, and R #7, or a connected region of the regions R #3, R #4, and R #6 exceeds 4 KB. When there is a connected region exceeding 4 KB, the re-compressing unit 18 performs a re-compressing process that uses the divided compressing method. After that, the re-compressing unit 18 notifies the storing processing unit 19 that the re-compressing process is completed. On the contrary, when there is no connected region exceeding 4 KB, the re-compressing unit 18 notifies the storing processing unit 19 that the compressing process was normal.

When having received the notification from the re-compressing unit 18 indicating that compressing process was normal, the storing processing unit 19 obtains the compressed data 300 from the compression buffer 17. After that, the storing processing unit 19 stores the obtained compressed data 300 into the storage unit 30. Subsequently, the storing processing unit 19 stores information indicating an overlap compressing process, which is a compressing process using the common region, into a predetermined location in the reserved region, for example, of the meta data 143.

Figure 29:
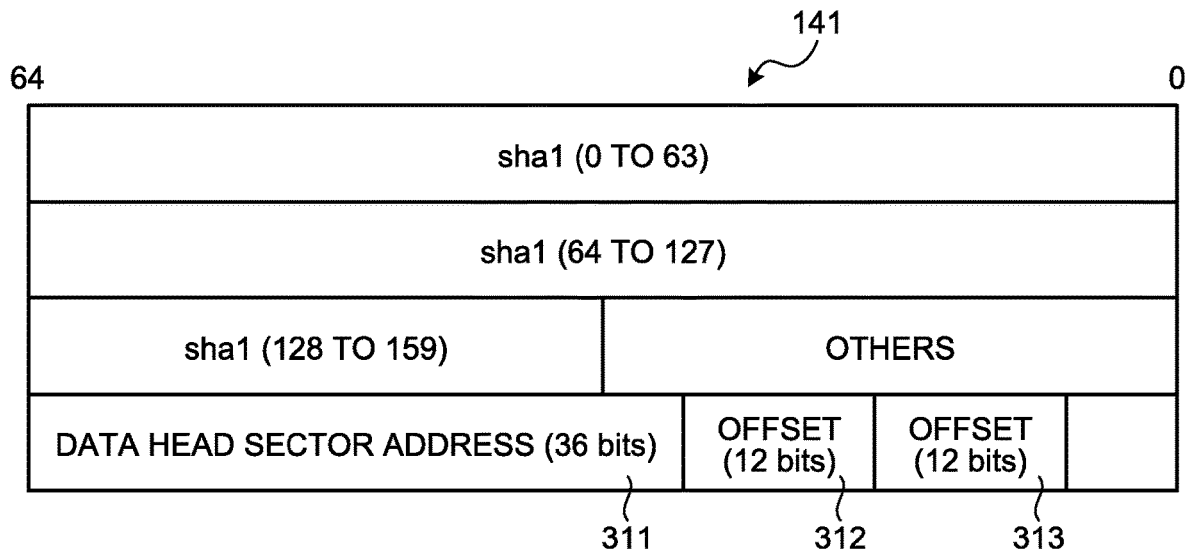
FIG. 29 is a drawing illustrating an example of met a data according to the fourth embodiment.

Further, the storing processing unit 19 stores the data head sector address in the storage unit 30 at which the compressed data 300 is stored, into the head address storing region 311 of the meta data 143, as illustrated in FIG. 29. FIG. 29 is a drawing illustrating an example of the meta data according to the fourth embodiment. Subsequently, into the offset storing region 312, the storing processing unit 19 stores the offset from the data head sector address of the compressed data 300 with respect to the region storing therein the offset from the head of the region R #2 to the position 331. Further, into the offset storing region 313, the storing processing unit 19 stores the offset from the data head sector address of the compressed data 300 with respect to the region storing therein the offset from the head of the region R #2 to the position 331.

Further, when having received the input of the notification from the re-compressing unit 18 indicating that the re-compressing process is completed, the storing processing unit 19 obtains the compressed data 300 from the compression buffer 17. After that, the storing processing unit 19 stores the obtained compressed data 300 into the storage unit 30. Subsequently, the storing processing unit 19 stores information indicating that a divided compressing process is performed on the input data 200, into a predetermined location in the reserved region, for example, of the meta data 143. Further, the storing processing unit 19 stores the data head sector address in the storage unit 30 at which the compressed data 300 is stored, into the head address storing region 311 of the meta data 143. Further, the storing processing unit. 19 stores the offsets of the positions 331 and 332 from the data head sector address, into the offset storing regions 312 and 313, respectively.

When decompressing the data on which the overlap compressing process has been performed, the reading unit 20 identifies the position of the head of the compressed data 300, the positions of the tail ends of the regions R #1 and R #3, the positions of the heads of the regions R #2 and R #4, and the positions 331 and 332, by referring to the meta data 143. After that, for example, the reading unit 20 reads the regions R #1, R #2, and R #5 from the compressed data 300, decompresses the regions R #1, R #2, and R #5 in the stated order, and obtains the data corresponding to 4 KB from the head, so as to obtain the data positioned on the head side among the three sections into which the input data 200 is divided. Further, for example, the reading unit 20 reads the regions R #1 to R #4 and R #7 from the compressed data 300, decompresses the regions R #1 to R #4 and R #7 in the stated order, and obtains the data corresponding to 4 KB from the head, so as to obtain the data positioned in the middle among the three sections into which the input data 200 is divided. Further, for example, the reading unit 20 reads the regions R #3, R #4, and R #7 from the compressed data 300, decompresses the regions R #3, R #4, and R #7 in the stated order, and obtains the data corresponding to 4 KB from the head, so as to obtain the data positioned on the tail end side among the three sections into which the input data 200 is divided.

As explained above, the AFA according to the fourth embodiment performs the compressing processes on the input data by using the common regions, in such a manner that, when the 4-KB regions are decompressed from the compressed data, the pieces of data generated by dividing the input data into the three sections are contained. With this arrangement, the compression ratio is improved because the compressing processes are performed by using the pieces of data larger than the pieces of data corresponding to 4 KB in the input data. Further, by decompressing the predetermined pieces of 4-KB data in the compressed data, it is possible to obtain the pieces of data generated by dividing the input data into the three sections. It is therefore possible to reduce the reading of extra data. Consequently, it is possible to improve the IOPS value at the time of the reading. In other words, the AFA according to the fourth embodiment is able to contribute to an improvement of the processing capability and the compression ratio.

A Hardware Configuration

Figure 30:
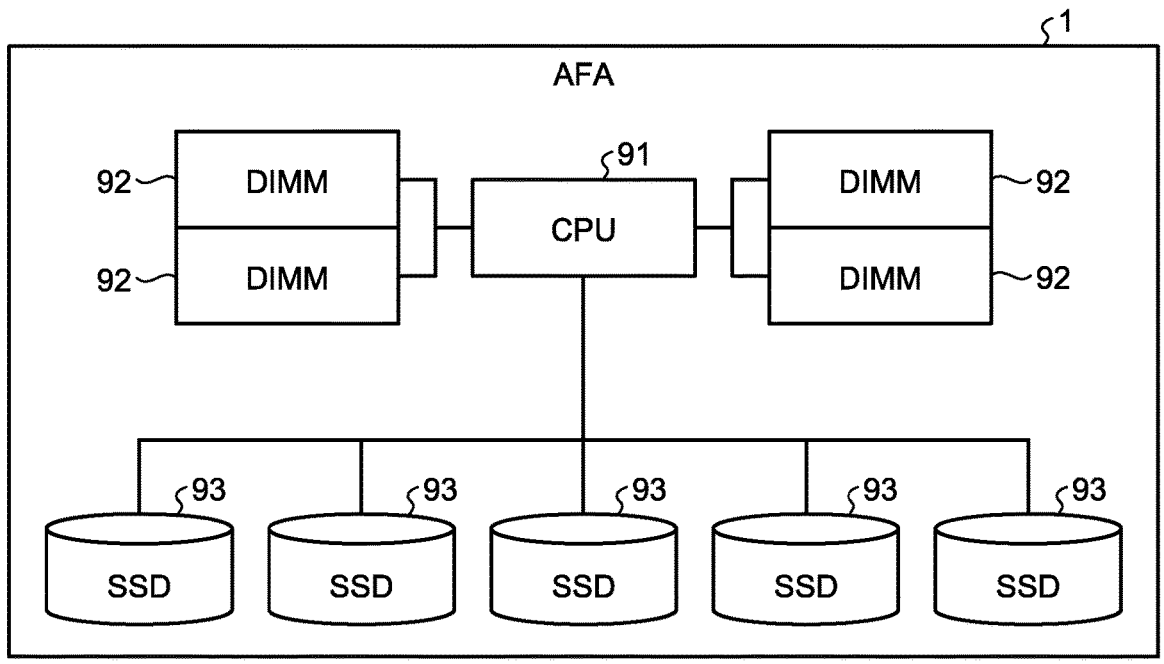
FIG. 30 is a diagram illustrating an example of a hardware configuration of an AFA.

FIG. 30 is a diagram illustrating an example of a hardware configuration of an AFA. As illustrated in FIG. 30, the AFA 1 includes a CPU 91, DIMMs 22, and SSDs 93. The CPU 91 is connected to the DIMMs 92 and to the SSDs S3 by a bus.

The DIMMs 92 include a plurality of DEAMs. Further, for example, the DIMMs 92 realize functions of the compression-purpose information storage unit 14 and the compression buffer 17 illustrated in FIG. 1. Further, the SSDs 93 realise functions of the storage unit 30 illustrated in FIG. 1.

Further, the storage unit 30 stores therein various types of computer programs (hereinafter, "programs") including programs used for realizing functions of the transmitting and receiving unit 11, the specifying unit 12, the compression buffer assigning unit 13, the common region compressing unit 15, the individual region compressing unit 16, the re-compressing unit 18, the storing processing unit 19, and the reading unit 20 illustrated in FIG. 1.

The CPU 91 reads any of the various types of programs from the storage unit 30, loads the read program into one or more DRAMs in the DIMMs 92, and executes the program. In this manner, the CPU 91 and the DIMMs 92 realize functions of the transmitting and receiving unit 11, the specifying unit 12, the compression buffer assigning unit 13, the common region compressing unit 15, the individual region compressing unit 16, the re-compressing unit 18, the storing processing unit 19, and the reading unit 20 illustrated in FIG. 1.

According to at least one aspect of the present disclosure, it is possible to improve the processing capability and the compression ratio.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invent ion have been described in detail, it should be understood that the various changes, substitutions, and alterations could be made hereto without departing from the spirit and scope of the invention.

What is claimed is:

1. An information processing apparatus comprising:
a specifying unit that specifies one or more dividing positions used for dividing input data into sections each having a predetermined size;
a former compressing unit that specifies compression positions including first compression positions and second compression positions in the input data, and that compresses former compression data that are sandwiched between a first compression position and a second compression position, the first compression positions corresponding to positions at which sizes from two ends of compressed data obtained by compressing the input data are equal to or larger than the predetermined size, the first compression position and the second compression position sandwiching adjacently-positioned dividing positions and a size between the first compression position and the second compression position is equal to or larger than the predetermined size; and
a latter compressing unit that compresses each of pieces of latter compression data that are adjacent to each of the pieces of former compression data in the input data, based on one or both of the pieces of former compression data and the piece of latter compression data.

2. The information processing apparatus according to claim 1, wherein
the predetermined size is half a size of the input data,
the specifying unit specifies a center position of the input data.

3. The information processing apparatus according to claim 2, wherein the former compressing unit includes:
a first compressing unit that predicts a first compression position in the input data corresponding to the position at which a size from one of the two ends is equal to the predetermined size in the compressed data and further performs, on first data extending from the center position to the first compression position, a first compressing process starting from the center position toward the first compression position on a basis of the first data; and
a second compressing unit that predicts a second compression position in the input data corresponding to the position at which a size from the other of the two ends is equal to the predetermined size in the compressed data and further performs, on second data extending from the center position to the second compression position, a second compressing process starting from the center position toward the second compression position on a basis of the first data and the second data, and the latter compressing unit includes:
a third compressing unit that performs a third compressing process starting from the first compression position toward the first end, on third data extending from the first compression position to a first end, on a basis of the first data, the second data, and the third data, the first end being either a head or a tail end of the input data, whichever is positioned closer to the first compression position; and a fourth compressing unit that performs a fourth compressing process starting from the second compression position toward a second end, on fourth data extending from the second compression position to the second end, on a basis of the first data, the second data, and the fourth data, the second end being either the head or the tail end of the input data, whichever is positioned closer to the second compression position.

4. The information processing apparatus according to claim 3, further comprising:
a storing processing unit that stores, into a storage unit, the compressed data generated from the first compressing process, the second compressing process, the third compressing process, and the fourth compressing process; and a decompressing unit that, upon receipt of a request to read former half data of the input data, reads and decompresses data having the predetermined size from a head of the compressed data on a basis of management data of the input data, obtains data having the predetermined size from a head of the decompressed data and that, upon receipt of a request to read latter half data of the input data, reads and decompresses data extending from a reference position in the compressed data to a tail end of the compressed data on a basis of the management data and obtains data having the predetermined size from the head of the decompressed data, the reference position being either the first compression position or the second compression position, whichever is positioned closer to the head of the input data, wherein the second compressing unit registers a first relative distance between the reference position and a center position of the compressed data into the reference position in the compressed data, and the storing processing unit registers, into the management data, the position of the head of the compressed data in the storage unit and a second relative distance from the position of the head of the compressed data to the reference position.

5. The information processing apparatus according to claim 3, wherein
the first compressing unit calculates a first compression ratio while performing the compressing process on the input data, starting from the center position toward the other of the two ends of the compressed data and further predicts the first compression position by estimating a second compression ratio of the compressed data for a section from the one of the two ends to a position at which the compressing process is finished, on the basis of the calculated first compression ratio, and the second compressing unit calculates a third compression ratio while performing the compressing process on the input data, starting from the center position toward the one of the two ends of the compressed data and further predicts the second compression position by estimating a fourth compression ratio of the compressed data for a section from the other of the two ends to a position at which the compressing process is finished, on the basis of the calculated third compression ratio.

6. The information processing apparatus according to claim 3, further comprising: a re-compressing unit that, in the compressed data generated by the first compressing unit, the second compressing unit, the third compressing unit, and the fourth compressing unit, when a size from a position corresponding to the first compression position to the one of the two ends exceeds the predetermined size or when a size from a position corresponding to the second compression position to the other of the two ends exceeds the predetermined size, discards a result of the compressing processes performed by the second compressing unit, the third compressing unit, and the fourth compressing unit, performs a compressing process on former half data extending from the head to the center position of the input data on a basis of the former half data, and also performs a compressing process on latter half data extending from the center position to the tail end of the input data on a basis of the latter half data.

7. A data compressing method comprising:
specifying one or more dividing positions used for dividing input data into sections each having a predetermined size;

specifying compression positions including first compression positions and second compression positions in the input data;

compressing each of pieces of former compression data that are sandwiched between a first compression position and a second compression position, the first compression positions corresponding to positions at which sizes from two ends of compressed data obtained by compressing the input data and from the dividing positions are each equal to or larger than the predetermined size; and compressing each of pieces of latter compression data that are adjacent to each of the pieces of former compression data in the input data, based on one or both of the pieces of former compression data and the piece of latter compression data.

8. A non-transitory computer-readable recording medium having stored therein a program that causes a computer to perform processes comprising:
specifying one or more dividing positions used for dividing input data into sections each having a predetermined size;

specifying compression positions including first compression positions and second compression positions in the input data;

compressing each of pieces of former compression data that are sandwiched between a first compression position and a second compression position, the first compression positions corresponding to positions at which sizes from two ends of compressed data obtained by compressing the input data and from the dividing positions are each equal to or larger than the predetermined size; and compressing each of pieces of latter compression data that are adjacent to each of the pieces of former compression data in the input data, based on one or both of the pieces of former compression data and the piece of latter compression data.

* * * * *